United States Patent
Frei

(10) Patent No.: US 9,929,707 B1
(45) Date of Patent: Mar. 27, 2018

(54) DISTRIBUTED AMPLIFIERS WITH IMPEDANCE COMPENSATION CIRCUITS

(71) Applicant: NXP USA, Inc., Austin, TX (US)

(72) Inventor: Jeffrey Alois Frei, Hawthorn Woods, IL (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/384,483

(22) Filed: Dec. 20, 2016

(51) Int. Cl.
| | |
|---|---|
| *H03F 3/60* | (2006.01) |
| *H01L 23/66* | (2006.01) |
| *H03F 3/195* | (2006.01) |
| *H03F 3/213* | (2006.01) |

(52) U.S. Cl.
CPC ............ *H03F 3/604* (2013.01); *H01L 23/66* (2013.01); *H03F 3/195* (2013.01); *H03F 3/213* (2013.01); *H01L 2223/6611* (2013.01); *H03F 2200/225* (2013.01); *H03F 2200/451* (2013.01)

(58) Field of Classification Search
CPC .................................. H03F 3/604; H01L 23/66
See application file for complete search history.

(56) References Cited

U.S. PATENT DOCUMENTS

| 3,218,569 | A | * | 11/1965 | Beck | .......................... | H03F 1/20 |
| | | | | | | 330/54 |
| 3,495,183 | A | * | 2/1970 | Doundoulakis | ........... | H03F 1/18 |
| | | | | | | 330/277 |
| 6,342,815 | B1 | * | 1/2002 | Kobayashi | .............. | H03F 3/605 |
| | | | | | | 330/286 |
| 6,614,307 | B1 | | 9/2003 | Zhao et al. | | |
| 7,880,558 | B2 | | 2/2011 | Frei | | |
| 2003/0184384 | A1 | * | 10/2003 | Orr | .......................... | H03F 1/565 |
| | | | | | | 330/286 |
| 2006/0055464 | A1 | * | 3/2006 | Leyten | .................... | H03F 3/605 |
| | | | | | | 330/286 |
| 2017/0099038 | A1 | * | 4/2017 | Kobayashi | .............. | H03F 3/604 |

\* cited by examiner

*Primary Examiner* — Patricia T Nguyen
(74) *Attorney, Agent, or Firm* — Sherry W. Schumm

(57) ABSTRACT

An embodiment of a distributed amplifier includes an output collection line, a plurality of tap nodes distributed along the output collection line, and a plurality of amplification paths coupled to the tap nodes. An embodiment of an amplification path includes an amplifier and a compensation circuit. The amplifier is configured to receive and amplify an input RF signal to produce an amplified RF signal at an amplifier output. A compensation circuit input is electrically coupled to the amplifier output, and a compensation circuit output is electrically coupled to one of the tap nodes. The compensation circuit includes a series inductance electrically coupled between the compensation circuit input and the compensation circuit output, and a shunt capacitance electrically coupled between the series inductance and a ground reference node. The amplifiers and the compensation circuit may be monolithically implemented on a single substrate, or may be implemented on separate substrates.

22 Claims, 10 Drawing Sheets

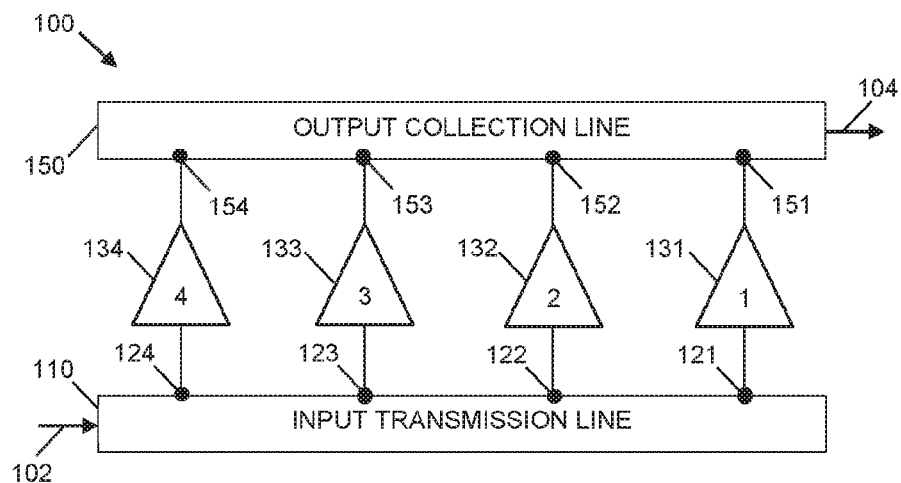
FIG. 1 -PRIOR ART-
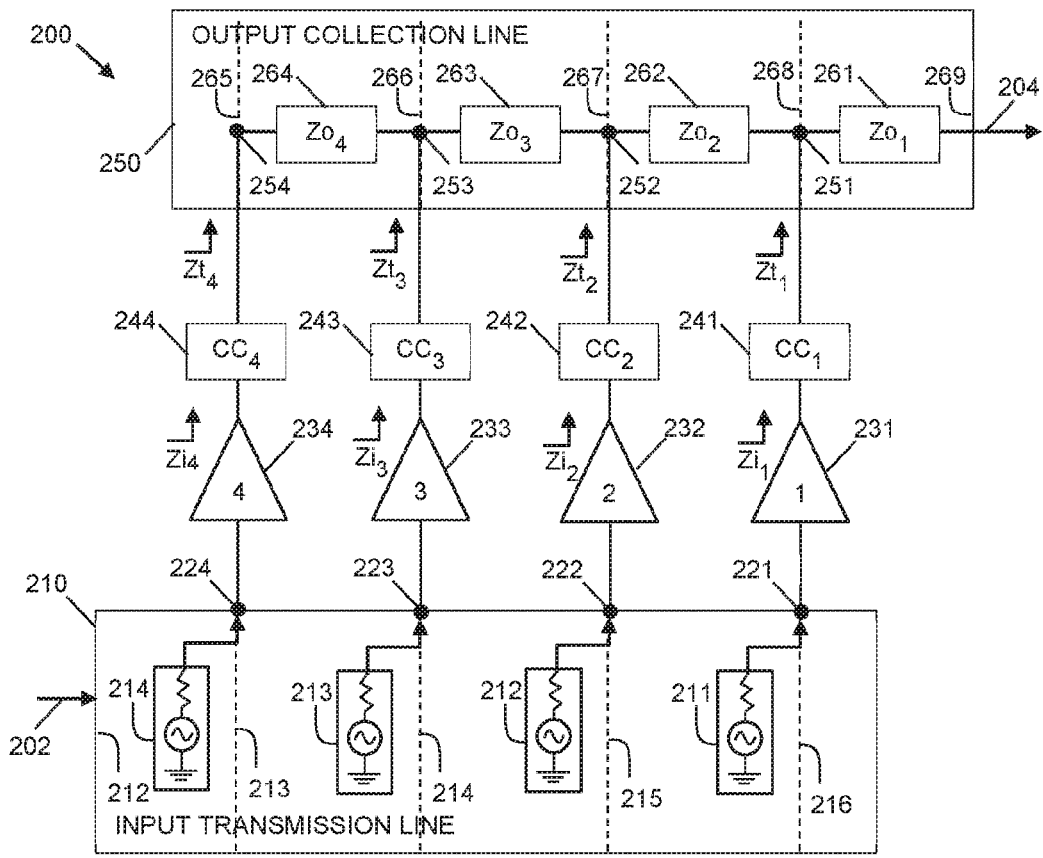
FIG. 2

DISTRIBUTED AMPLIFIERS WITH IMPEDANCE COMPENSATION CIRCUITS

TECHNICAL FIELD

Embodiments of the subject matter described herein relate generally to distributed amplifiers, and more particularly to distributed amplifiers with compensation circuits between the active devices and the tap nodes spatially located on the output collection line.

BACKGROUND

A distributed amplifier has a unique architecture with the inherent benefit of supporting very broad band operation, when compared with more conventional amplifier architectures. As illustrated in FIG. 1, a typical distributed amplifier 100 includes a plurality of periodically distributed amplifier paths (or "feeding branches") coupled between an input transmission line 110 and an output collection line 150. More specifically, each feeding branch includes a power amplifier 131-134 with an input coupled to the input transmission line 110 at a feeding node 121-124, and with an output coupled to the output collection line 150 at a tap node 151-154.

The input transmission line 110 is configured to receive a radio frequency (RF) input signal 102 at an input end of the transmission line 110. The feeding nodes 121-124 are spaced apart (or "distributed") along a length of the input transmission line 110, and each input transmission line segment (i.e., a portion of transmission line between consecutive feeding nodes 121-124) is configured to impart a delay to the input RF signal as the signal propagates through the segment. Accordingly, the feeding node 124 closest to the input end receives the RF signal after a relatively short delay, and the feeding node 121 farthest from the input end receives the RF signal after a relatively long delay.

The output collection line 150 is configured to combine amplified RF signals produced by the feeding branches, and to produce an output RF signal 104 at an output end of the output collection line 150. Similar to the feeding nodes 121-124, the tap nodes 151-154 also are spaced apart along a length of the output collection line 150, and each output collection line segment (i.e., a portion of transmission line between consecutive tap nodes 151-154) is configured to impart a delay to the RF signal as the signal propagates through the output collection line segment. Accordingly, the amplified RF signal produced by the amplifier path with a tap node 154 farthest from the output end is produced at the output end after a relatively long delay through the output collection line 150, and the amplified RF signal produced by the amplifier path with a tap node 151 closest to the output end is produced at the output end after a relatively short delay through the output collection line 150.

The RF signals propagating toward the output end of the output collection line 150 combine at each of the tap nodes 151-153 with an amplified RF signal received from a corresponding feeding branch. Accordingly, the tap nodes 151-153 function as combining or summing nodes, and from tap node 154 to tap node 151, the RF energy continues to build along the output collection line 150. The positions of the feeding nodes 121-124 and the positions of the tap nodes 151-154 along the input transmission line 110 and the output collection line 150, respectively, are selected so that the amplified RF signal produced by each feeding branch is combined in phase with the preceding signal propagating on the output line at the tap nodes 151-153. In other words, the total delay through the amplifier 100 that is experienced by any component of the RF signal is the same between the input end of the input transmission line 110 and the output end of the output collection line 150, regardless of which feeding branch the signal component traveled through.

Further, the driving point impedances at the tap nodes 151-154 may have very broad band constant values when the output collection line 150 has been appropriately optimized. To achieve the desired broad band loads along the output collection line 150, the characteristic impedances of the output collection line segments may be designed to step in a particular geometric sequence. An output collection line 150 designed in such a manner is referred to as a "tapered" transmission line.

A distributed amplifier performs at its best when every aspect is optimized. This includes correctly managing signal amplitude and phase through the amplifier, judiciously choosing interim impedance levels for the segments of the output collection line 150, and correctly sizing the amplifier's active devices (e.g., the power transistors of the feeding branch amplifiers 131-134). However, such optimizations often are not enough to ensure desired performance in conventionally-designed distributed amplifiers, particularly in higher power distributed amplifiers intended for wideband operation.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 1 is a simplified conceptual diagram of a conventional distributed amplifier;

FIG. 2 is a simplified diagram of a distributed amplifier, in accordance with an example embodiment;

DETAILED DESCRIPTION

Figure 3:
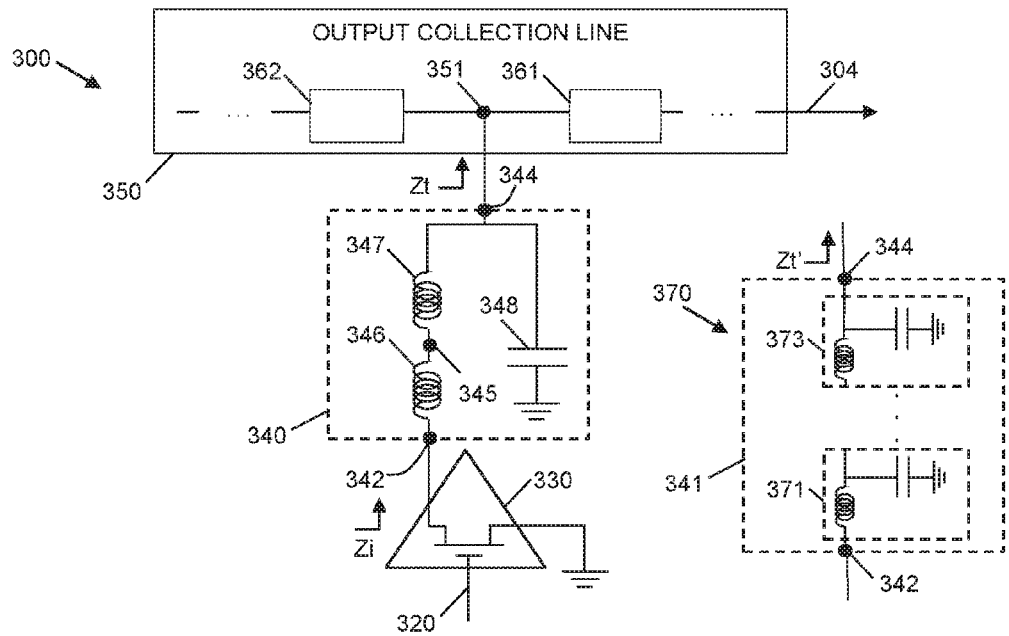
FIG. 3 is a schematic diagram of a compensation circuit implemented in a feeding branch of a distributed amplifier, in accordance with an example embodiment.

In a conventionally-designed distributed amplifier, the output parasitics (e.g., drain-source capacitance, Cds) of the active devices tend to curtail the amplifier's performance in the upper end of the amplifier's operational frequency range, especially in amplifiers that are intended to produce output RF signals with power levels of several Watts or more. More particularly, the amplifier efficiency (|EFF|) and saturated power (Psat) ceilings tend to fall off dramatically with increasing frequency in conventionally-designed distributed amplifiers. One reason for this performance deficit is that the active device output parasitics tend to compromise the otherwise relatively constant broadband loads that would be seen at the tap nodes of the amplifier's output collection line. More particularly, the output capacitances result in an increasing susceptance ($j\omega C$) as the frequency of operation increases.

Embodiments of distributed radio frequency (RF) amplifiers are described herein that include compensation circuits between the amplifier's active devices and the tap nodes at the output collection line. The compensation circuits function to add pre-conditioning to the tap node impedances, which are driven by the active devices, thus better matching the active devices into the structure's tap nodes. Implementation of the compensation circuits in the feeding branches may result in more ideal RF performance, even for higher power amplifiers. Further, implementation of the compensation circuit embodiments in the feeding branches may significantly enhance the DC to RF conversion, particularly at upper frequencies within an amplifier's operational range. Further still, the active devices and the compensation circuits may be implemented monolithically, in some embodiments, thus enabling a relatively compact amplifier. In still other embodiments, portions of the compensation circuits may be realized using discrete passive components (e.g., discrete inductors and/or capacitors), bondwires (e.g., as inductances), and/or passive components included within distinct integrated passive devices. Each of the various embodiments may have performance, cost, and/or other advantages.

FIG. 2 is a simplified diagram of a distributed amplifier 200, in accordance with an example embodiment. Distributed amplifier 200 includes a plurality of amplifier paths (or "feeding branches") periodically distributed, coupling an input transmission line 210 and an output collection line 250. Although the embodiment of FIG. 2 illustrates a distributed amplifier 200 with a four path feeding branch arrangement, embodiments of the inventive subject matter may be implemented in distributed amplifiers with fewer (e.g., as few as two) or more (e.g., ten or more) feeding branches.

The input transmission line 210 is configured to receive an RF input signal 202 at an input end 212 of the transmission line 210. The feeding nodes 221-124 are spaced apart (or "distributed") along a length of the input transmission line 210, and each input transmission line segment (i.e., a portion of transmission line between consecutive feeding nodes 221-224) is configured to impart a delay to the input RF signal as the signal propagates through the segment. Accordingly, the feeding node 224 closest to the input end receives the RF signal after a relatively short delay, and the feeding node 221 farthest from the input end receives the RF signal after a relatively long delay.

More specifically, the input transmission line 210 includes a plurality of consecutive, electrically-conductive, input transmission line segments, with boundaries between the segments being indicated with dashed lines in FIG. 2, and with each segment being modeled by a series-coupled signal source and resistance 211-214. Input transmission line 210 has an input end 212 and an output end 216. Similarly, each segment has an input end and an output end, where the output end of one segment corresponds to the input end of a next consecutive downstream segment. For example, a first segment has input end 212 and output end 213, a second segment has an input end 213 and an output end 214, a third segment has an input end 214 and an output end 215, and a fourth segment has an input end 215 and an output end 216. Generally, the output end of each segment corresponds to the location of a feeding node 221-224 for the segment. Thus, the output end 213 of the first segment corresponds to the location of the feeding node 224 for the first segment, and so on.

Each feeding branch includes an amplifier or a power amplifier 231-234 with an input coupled to the input transmission line 210 at a feeding node 221-224, and with an output coupled to the output collection line 250 at a tap node 251-254. According to various embodiments, each power amplifier 231-234 may be implemented as a single stage or a multi-stage power amplifier, with each amplification stage essentially being provided by a semiconductor-based power transistor (i.e., an "active device"). As mentioned previously, each active device may have output parasitics (e.g., including Cds), which could detrimentally affect the amplifier's performance by compromising otherwise relatively constant broadband loads that would be seen at the tap nodes 251-254.

According to an embodiment, and as will be described in more detail below, each feeding branch also includes an embodiment of a compensation circuit 241-244, $CC_1$-$CC_4$, coupled between the output of each power amplifier 231-234 and each tap node 251-254. According to various embodiments, the compensation circuits 241-244 function to pre-condition the tap node impedances, thus better matching the active devices into the tap nodes 251-254. In other words, the compensation circuits 241-244 function to convert the amplifier driving impedances $Zi_1$-$Zi_4$ into constant and broadband tap node impedances $Zt_1$-$Zt_4$.

As will be explained in more detail later, the compensation circuits 241-244 may be implemented as passive filter circuits comprised of various arrangements of passive elements (e.g., inductances and capacitances). The passive elements may take various forms. For example passive inductances may be implemented as bondwires, bondwire arrays, discrete inductors (e.g., chip inductors or "chip coils", including wire wound, multilayer, and film types of chip inductors, among others), integrated spiral inductors (e.g., printed or patterned coils in a conductive layer of an integrated circuit), conductive traces, or other suitably inductive structures. Passive capacitances may be implemented as discrete capacitors (e.g., chip capacitors, including monolithic ceramic capacitors, conductive polymer capacitors, and microchip capacitors, among others), area capacitors (e.g., with electrodes formed from overlapping portions of multiple adjacent conductive layers separated by dielectric material), or other suitably capacitive structures. Besides including inductive and capacitive elements, as described in detail below, the compensation circuits 241-244 also may include resistive elements, in other embodiments.

According to some embodiments, each of the multiple compensation circuits 241-244 in distributed amplifier 200 are identical to each other. In other embodiments, the multiple compensation circuits 241-244 may have the same components (e.g., the same number and arrangement of inductances and capacitances), but the values of the components may be different in different feeding branches. In still other embodiments, the multiple compensation circuits 241-244 may have different components (e.g., a different number and/or arrangement of inductances and capacitances). Specific example embodiments of compensation circuits 241-244 will be illustrated and described in more detail in conjunction with FIGS. 3, 4, and 6-10, below.

The output collection line 250 is configured to combine amplified RF signals produced by the feeding branches, and to produce an output RF signal 204 at an output end of the output collection line 250. Similar to the feeding nodes 221-124, the tap nodes 251-154 also are spaced apart along a length of the output collection line 250, and each output collection line segment (i.e., a portion of transmission line between consecutive tap nodes 251-154) is configured to impart a delay to the RF signal as the signal propagates through the output collection line segment. Accordingly, the amplified RF signal produced by the amplifier path with a tap node 254 farthest from the output end is produced at the output end after a relatively long delay through the output collection line 250, and the amplified RF signal produced by the amplifier path with a tap node 251 closest to the output end is produced at the output end after a relatively short delay through the output collection line 250.

More specifically, the output collection line 250 includes a plurality of consecutive, electrically-conductive, output collection line segments, with boundaries between the segments being indicated with dashed lines in FIG. 2, and with each segment being modeled by an impedance block 261-264, $Z_{O_1}$-$Z_{O_4}$. Output collection line 250 has an input end 265 and an output end 269. Similarly, each segment has an input end and an output end, where the output end of one segment corresponds to the input end of a next consecutive downstream segment. For example, a first segment has input end 265 and output end 266, a second segment has an input end 266 and an output end 267, a third segment has an input end 267 and an output end 268, and a fourth segment has an input end 268 and an output end 269. Generally, the input end of each segment corresponds to the location of a tap node 251-254 for the segment. Thus, the input end 265 of the first segment corresponds to the location of the tap node 254 for the first segment, and so on.

According to an embodiment, the output collection line 250 is a tapered collection line. More specifically, the characteristic impedances 261-264, $Z_{O_1}$-$Z_{O_4}$, of the output collection line segments are designed to step in a particular geometric sequence so that the driving point impedances, $Z_{t_1}$-$Z_{t_4}$ at the tap nodes 251-254 have very broad band constant values. According to an embodiment, the driving point impedances of the tap nodes 251-254 may be relatively high. For example, when the 4-branch distributed amplifier 200 of FIG. 2 is configured to drive a 50 ohm load coupled to the amplifier output 204, the driving point impedance of each tap node 251-254 may be about 200 ohms (i.e., 4×50 ohms) (e.g., corresponding to point 512 on Smith chart 510, FIG. 5). If the distributed amplifier 200 of FIG. 2 were modified to include only three feeding branches, the driving point impedances of each tap node would be about 150 ohms (i.e., 3×50 ohms). Those of skill in the art would understand, based on the description herein, that the driving point impedances of each tap node would scale proportionally in distributed amplifiers with fewer or more than three or four tap nodes.

According to an embodiment, the characteristic impedances 261-264, $Z_{O_1}$-$Z_{O_4}$, of the output collection line segments have specific geometric ratios, with respect to each other. For example, when the 4-branch distributed amplifier 200 of FIG. 2 is configured to drive a 50 ohm load coupled to the amplifier output 204, the fourth segment may be designed to have a characteristic impedance 261, $Z_{O_1}$, of about 50 ohms, the third segment may be designed to have a characteristic impedance 262, $Z_{O_2}$, of about 66 ohms, the second segment may be designed to have a characteristic impedance 263, $Z_{O_3}$, of about 100 ohms, and the first segment may be designed to have a characteristic impedance 264, $Z_{O_4}$, of about 200 ohms. The characteristic impedances of output collection line segments for a distributed amplifier with fewer or more feeding branches (i.e., fewer or more collection line segments) would similarly scale, in other embodiments.

In still other alternate embodiments, a distributed amplifier may be configured to drive a load with an impedance that is different from 50 ohms. When the load impedance is less than 50 ohms, the driving point impedance of each of the tap nodes 251-254 may be less, as well. Further, the characteristic impedances 261-264 may be proportionally less. For example, when the 4-branch distributed amplifier 200 of FIG. 2 is configured to drive a 12.5 ohm load coupled to the amplifier output 204, the driving point impedance of each tap node 251-254 may be about 50 ohms (i.e., 4×12.5 ohms) (e.g., corresponding to the center point of Smith chart 510, FIG. 5), and the characteristic impedances 261-264 may have approximate values such as $Z_{O_4}$=50 ohms; $Z_{O_3}$=25 ohms; $Z_{O_2}$=16.67 ohms; and $Z_{O_1}$=12.5 ohms. When the load impedance is less than 50 ohms, the inductance values of various inductances (e.g., inductances 346, 347, 446, 447, FIGS. 3, 4) in some embodiments of compensation circuits 241-244 may be lower that the inductance values designed for a 50 ohm load. In some cases, this may enable bondwire inductors (e.g., inductors 646, 846, 946, FIGS. 6, 8, 9) and/or discrete inductors (e.g., inductors 647, 747, 947, 1042-1044, FIGS. 6, 7, 9, 10) to be replaced with printed or integrated inductors (e.g., inductors 847, FIG. 8), leading to potentially less expensive, more robust, and/or more compact compensation circuits.

The RF signals propagating toward the output end 269 of the output collection line 250 combine at tap nodes 251-253 with each amplified RF signal received from each corresponding feeding branch. Accordingly, the tap nodes 251-253 function as combining or summing nodes, and from tap node 254 to tap node 251, the RF energy continues to build along the output collection line 250. The positions of the feeding nodes 221-224 and the positions of the tap nodes 251-254 along the input transmission line 210 and the output collection line 250, respectively, are selected so that the amplified RF signals produced by the feeding branches combine in phase at the tap nodes 251-253. In other words, the total delay through the amplifier 200 that is experienced by any component of the RF signal is the same between the input end 212 of the input transmission line 210 and the output end 269 of the output collection line 250, regardless of which feeding branch the signal component traveled through.

Various embodiments of compensation circuits (e.g., compensation circuits 231-234, FIG. 2) will now be described in more detail in conjunction with FIGS. 3 and 4. More specifically, FIG. 3 is a schematic diagram of a portion 300 of a distributed amplifier (e.g., distributed amplifier 200, FIG. 2) that includes a compensation circuit 340 (e.g., one of compensation circuits 231-234, FIG. 2) in a feeding branch, in accordance with an example embodiment. Compensation circuit 340 is electrically coupled between an output of an amplifier 330 (e.g., one of power amplifiers 231-234, FIG. 2) and a tap node 351 (e.g., one of tap nodes 251-254, FIG. 2) of an output collection line 350 (e.g., output collection line 250, FIG. 2).

More specifically, in an embodiment, compensation circuit 340 has an input 342 that is electrically coupled to an output terminal of a driver stage power transistor of amplifier 330. For example, the power transistor may be a field effect transistor (FET) with a control terminal (e.g., a gate terminal) configured to receive an input RF signal 320, a first output terminal (e.g., a drain terminal) coupled to the input 342 of the compensation circuit 340, and a second output terminal (e.g., a source terminal) coupled to a ground reference voltage. Further, compensation circuit 340 has an output 344 that is electrically coupled to a tap node 351 at an input end of a segment 361 of an output collection line 350. Assuming the tap node 351 is not a farthest tap node from an output 304 of the output collection line 350, the tap node 351 couples to the output collection line 350 between two consecutive segments 361, 362.

In the illustrated embodiment, compensation circuit 340 includes two series coupled inductances 346, 347 electrically coupled between the input 342 and output 344 of the compensation circuit 340, with an intermediate node 345 between the inductances 346, 347. In alternate embodiments, a compensation circuit may include a single inductance or more than two series inductances electrically coupled between the input 342 and output 344. For example, and as will be exemplified in the embodiments of FIGS. 6-10, inductances 346, 347 may be implemented with various combinations of bondwires, bondwire arrays, discrete inductors, integrated spiral inductors, conductive traces, or other suitably inductive structures. In addition, the compensation circuit 340 includes a shunt capacitance 348 with a first terminal (or electrode or plate) electrically coupled to the series inductances 346, 347 (or to the output 344), and a second terminal (or electrode or plate) electrically coupled to a ground reference node. For example, and as will also be exemplified in the embodiments of FIGS. 6-10, capacitance 348 may be implemented with a discrete capacitor, and area capacitor, or another suitably capacitive structure.

According to an embodiment, the components 346-348 of compensation circuit 340 form a second-order low pass circuit, with component values that are configured to convert the amplifier driving impedance Zi into a broadband tap node impedance Zt. For example, for a 4-branch distributed amplifier configured to be coupled to a 50 ohm load (and thus to have a tap driving point impedance of about 200 ohms), the components 346-348 of compensation circuit 340 may be configured to convert the amplifier driving impedance into a tap impedance of about 200 ohms across an operational frequency range of about 200 megahertz (MHz) to about 1200 MHz or more. For example, to achieve such a conversion, the series combination of inductances 346, 347 may have an inductance value in a range of about 10 nanohenries (nH) to about 40 nH (e.g., about 27 nH in one example), and the shunt capacitance 348 may have a capacitance value in a range of about 0.3 picofarads (pF) to about 1.5 pF (e.g., about 0.65 pF in one example). In other embodiments, the load impedance, tap driving node impedance, and/or operational frequency range may be different with correspondingly different compensation circuit component values.

Compensation circuit 340 includes a single instance of a second-order low pass circuit (i.e., a series inductance coupled to a shunt capacitance). In other embodiments, and as indicated in cut-out 370, alternate embodiments of a compensation circuit 341 may include multiple instances of second-order low pass circuits 371, 373 (e.g., from two to four or more) coupled in series between the compensation circuit input 342 and output 344. As will be explained in more detail in conjunction with FIG. 5, below, each additional instance of a second-order low pass circuit 371, 373 may enable the compensation circuit 341 to move the tap impedances, Zt', at the output of compensation circuit 341 (looking toward the tap node), closer and closer to an ideally-matched intrinsic impedance.

Figure 4:
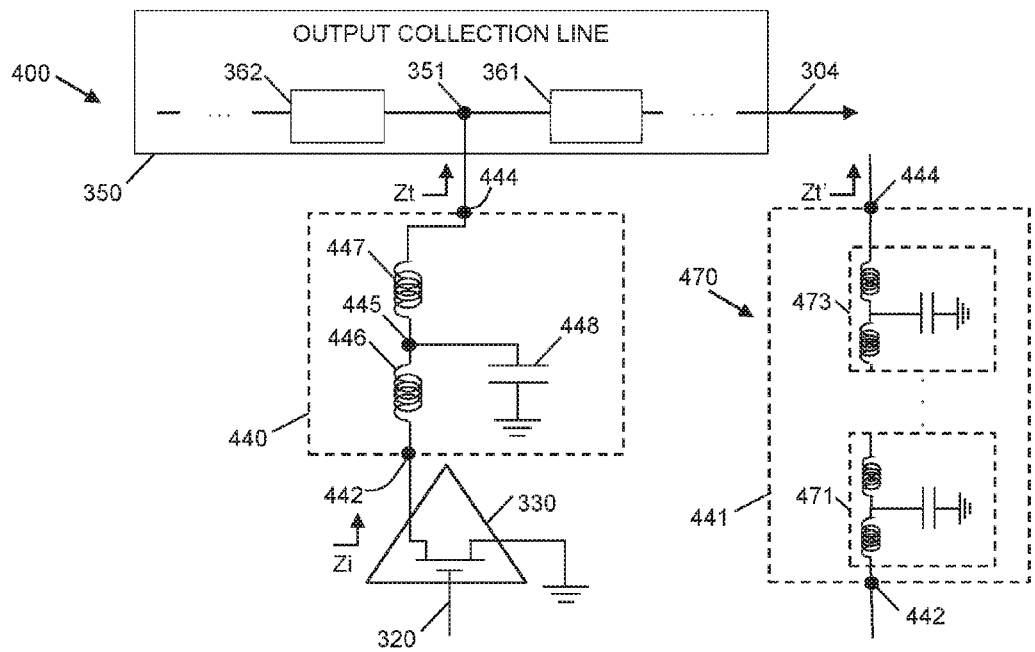
FIG. 4 is a schematic diagram of a compensation circuit implemented in a feeding branch of a distributed amplifier, in accordance with another example embodiment.

FIG. 4 is a schematic diagram of a portion 400 of a distributed amplifier (e.g., distributed amplifier 200, FIG. 2) that includes a compensation circuit 440 (e.g., one of compensation circuits 231-234, FIG. 2) implemented in a feeding branch, in accordance with another example embodiment. Compensation circuit 440 is electrically coupled between an output of an amplifier 330 (e.g., one of power amplifiers 231-234, FIG. 2) and a tap node 351 (e.g., one of tap nodes 251-254, FIG. 2) of an output collection line 350 (e.g., output collection line 250, FIG. 2). The coupling of compensation circuit 440 to the amplifier 330 and the output collection line 350 is substantially similar to the connection of compensation circuit 340 (FIG. 3) to the amplifier 330 and output collection line 350, as indicated by the identical reference numbers associated with the amplifier 330 and output collection line 350. For brevity, the details of the amplifier 330 and the output collection line 350 are not repeated here, but apply equally to the description of the portion 400 of the distributed amplifier illustrated in FIG. 4.

Similar to the embodiment of FIG. 3, in the embodiment of FIG. 4, compensation circuit 440 has an input 442 that is electrically coupled to an output terminal (e.g., a drain terminal) of a driver stage power transistor of amplifier 330. Further, compensation circuit 440 has an output 444 that is electrically coupled to a tap node 351 at an input end of a segment 361 of an output collection line 350.

The difference between the embodiment of FIG. 3 and the embodiment of FIG. 4 is in the structure of compensation circuit 440 in comparison with the structure of compensation circuit 340 (FIG. 3). In the illustrated embodiment, compensation circuit 440 includes two series coupled inductances 446, 447 electrically coupled between the input 442 and output 444 of the compensation circuit 440, with an intermediate node 445 between the inductances 446, 447. In various embodiments, each of inductances 446, 447 may include a single inductance or more than one inductance electrically coupled in series. For example, and as will be exemplified in the embodiments of FIGS. 6-10, inductances 446, 447 may be implemented with various combinations of bondwires, bondwire arrays, discrete inductors, integrated spiral inductors, conductive traces, or other suitably inductive structures. In addition, the compensation circuit 440 includes a shunt capacitance 448 with a first terminal (or electrode or plate) electrically coupled to the intermediate node 445 between the series inductances 446, 447, and a second terminal (or electrode or plate) electrically coupled to a ground reference node. For example, and as will also be exemplified in the embodiments of FIGS. 6-10, capacitance 448 may be implemented with a discrete capacitor, and area capacitor, or another suitably capacitive structure.

According to an embodiment, the components 446-448 of compensation circuit 440 form a third-order low pass circuit, with component values that are configured to convert the amplifier driving impedance Zi into a broadband tap node impedance Zt. For example, for a 4-branch distributed amplifier configured to be coupled to a 50 ohm load (and thus to have a tap driving point impedance of about 200 ohms), the components 446-348 of compensation circuit 440 may be configured to convert the amplifier driving impedance into a tap impedance of about 200 ohms across an operational frequency range of about 200 MHz to about 1200 MHz or more. For example, to achieve such a conversion, inductance 446 may have an inductance value in a range of about 25 nH to about 45 nH (e.g., about 34 nH in one example), inductance 447 may have an inductance value in a range of about 8 nH to about 20 nH (e.g., about 14 nH in one example), and the shunt capacitance 448 may have a capacitance value in a range of about 0.4 picofarads (pF) to about 1.5 (e.g., about 0.65 pF in one example). In other embodiments, the load impedance, tap driving node impedance, and/or operational frequency range may be different with correspondingly different compensation circuit component values.

Compensation circuit 440 includes a single instance of a third-order low pass circuit (i.e., two series inductances with a shunt capacitance coupled to an intermediate node). In other embodiments, and as indicated in cut-out 470, alternate embodiments of a compensation circuit 441 may include multiple instances of third-order low pass circuits 471, 473 (e.g., from two to four or more) coupled in series between the compensation circuit input 442 and output 444. In still other embodiments, a compensation circuit may include any of various combinations of second-order low pass circuits, third-order low pass circuits, and other types of filter circuits and/or passive components.

Figure 5:
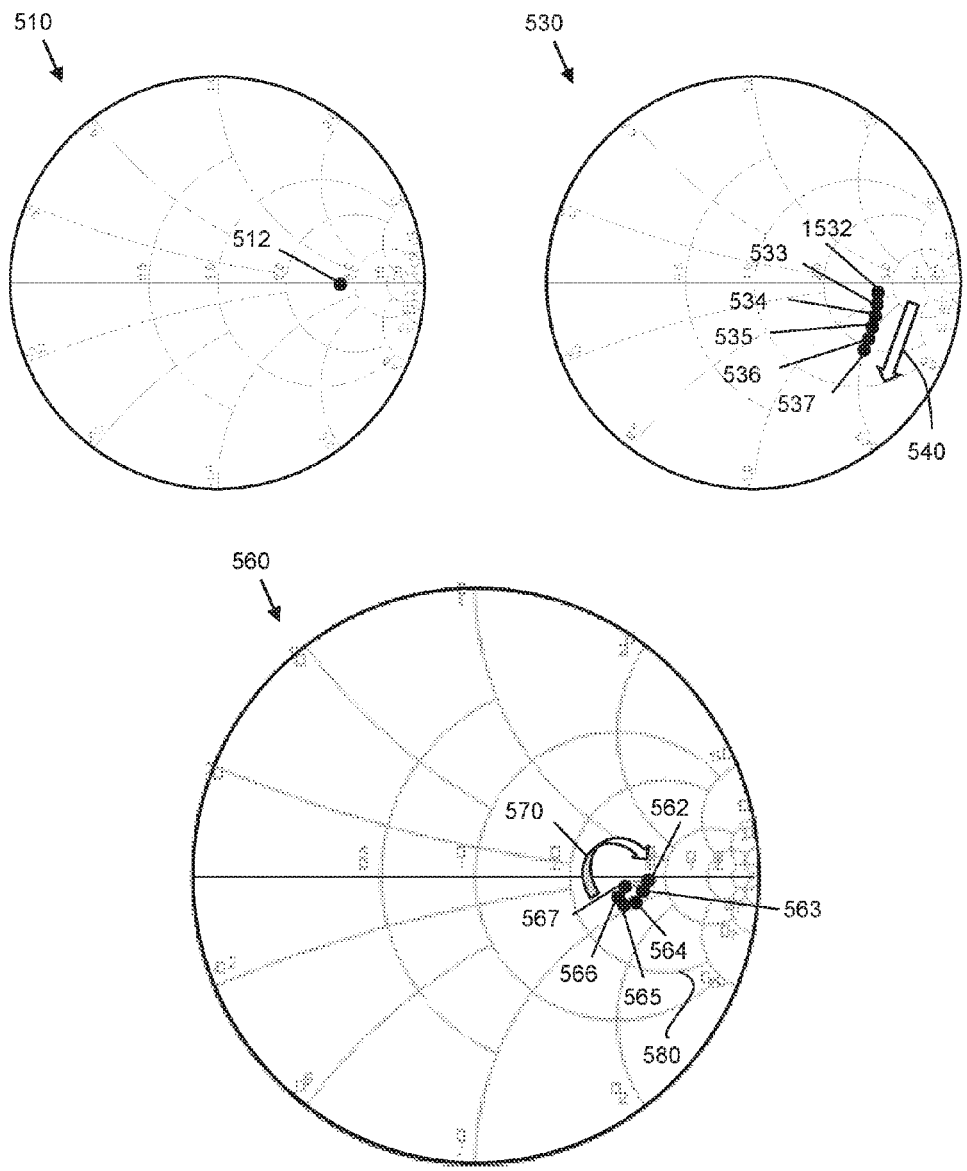
FIG. 5 includes a collection of Smith charts comparing tap impedance and intrinsic impedance for a conventional distributed amplifier and a distributed amplifier designed in accordance with an example embodiment.

To illustrate the wideband impedance conversion provided by a compensation circuit (e.g., one of compensation circuits 340, 440, FIGS. 3, 4), reference is made to FIG. 5, which includes three Smith charts 510, 530, 560 illustrating various impedance characteristics for a conventional 4-branch distributed amplifier (e.g., amplifier 100, FIG. 1) and an embodiment of a 4-branch distributed amplifier (e.g., amplifier 200, FIG. 2) that includes a compensation circuit, where both amplifiers are configured to drive a 50 ohm load. The Smith charts 510, 530, 560 specifically indicate impedance characteristics over an example operational frequency range of 200-1200 MHz.

Referring first to Smith chart 510, point 512 represents a broadband tap node impedance of about 200 ohms, or the desired tap node impedance, Zt, for each of the 4 tap nodes (151-154, 251-254, FIGS. 1, 2) of either 4-branch distributed amplifier (e.g., amplifier 100 or 200, FIGS. 1, 2), assuming each output collection line (e.g., lines 150, 250, FIGS. 1, 2) has been properly optimized for a 50 ohm load. Optimization in this context means that the driving signals to the tap nodes are provided with the correct phase, and the characteristic impedances, Zo1-Zo4, of each of the segments (e.g., impedances 261-264, FIG. 2) step in a proper geometric sequence. Such optimization ensures broadband loads at the tap nodes. In particular, the tap node impedances for all frequencies between 200-1200 MHz all land on point 512 of the Smith chart 510, which corresponds to a 200 ohm impedance. This indicates a very broadband tap node impedance.

That said, performance issues with conventionally-designed distributed amplifiers (e.g., amplifier 100, FIG. 1) at higher frequencies and power levels becomes evident upon inspection of Smith chart 530. Specifically, Smith chart 530 represents the corresponding intrinsic impedances, Zi, at the output of an active device (looking toward a tap node) across an example operational frequency range from 200-1200 MHz for a distributed amplifier (e.g., amplifier 100, FIG. 1) that does not include an embodiment of a compensation circuit (e.g., compensation circuits 231-234, FIG. 2).

At higher frequencies and power levels, the output capacitance (e.g., Cds) of each driver-stage active device detrimentally affects the otherwise relatively constant load that would be seen by the current source of the active device, and adds an increasing susceptance ($j\omega C$) versus frequency. This exhibits itself in Smith chart 530 by spreading the tap node impedances down and to the left (indicated by arrow 540) with increasing frequency. In other words, the active device parasitics (e.g., Cds) cause the current source to see a deteriorating tap node impedance as the operational frequency increases, with the most impact occurring at the high end of the operational frequency range (e.g., at 1200 MHz). More specifically, point 532 corresponds to the intrinsic impedance at 200 MHz, point 537 corresponds to the intrinsic impedance at 1200 MHz, and points 533-536 correspond to intrinsic impedances at increasing frequencies between 200 MHz and 1200 MHz.

Embodiments of compensation circuits discussed herein are intended to compensate for the active device output capacitance over a broadband and relatively-high operational frequency range. Smith chart 560 represents the intrinsic improvements that may be achieved by using a compensation circuit (e.g., one of compensation circuits 231-234, 340, 440, FIGS. 3, 4) between an active device and a tap node, in accordance with the various embodiments of the inventive subject matter. More specifically, Smith chart 560 represents the intrinsic impedances, Zi at the current sources, which are now improved across an example operational frequency range from 200 MHz to 1200 MHz for a distributed amplifier (e.g., amplifier 200, FIG. 2) that includes an embodiment of a compensation circuit (e.g., one of compensation circuits 231-234, 340, 440, FIGS. 3, 4).

Essentially, the compensation circuit causes the response to curl back toward (e.g., in a direction indicated by arrow 570), or replicate, the broadband tap node impedance of 200 ohms (e.g., point 512 of Smith chart 510) at the active device current source. More specifically, in Smith chart 560, point 562 corresponds to the intrinsic impedance at 200 MHz, point 567 corresponds to the intrinsic impedance at 1200 MHz, and points 563-566 correspond to intrinsic impedances at increasing frequencies between 200 MHz and 1200 MHz. Dramatic improvements can be seen by comparing the compensated point 567 (i.e., intrinsic impedance at 1200 MHz) of Smith chart 560 with the uncompensated point 537 (i.e., intrinsic impedance at 1200 MHz) of Smith chart 530.

In operation, the series inductance(s) (e.g., inductances 346, 347, 446, 447, FIGS. 3, 4) of the compensation circuit pull the impedances clockwise along constant reactance curves (e.g., curve 580), and the shunt capacitance(s) (e.g., capacitances 348, 448, FIGS. 3, 4) pull the impedances back down toward the optimal broadband tap node impedance point (e.g., point 512 of Smith chart 510). Desirably, the inductance value(s) of the series inductance(s) are sufficient to pull the impedances to the top half of the Smith chart 560, and the capacitance value(s) of the shunt capacitance(s) are sufficient to pull the impedances back down to the bottom half of the Smith chart 560. When a compensation circuit includes multiple low-pass stages, as described above, each stage may incrementally pull the impedance point closer to the optimal broadband tap node impedance point, although the increase in the number of compensation circuit components may induce additional losses in the circuit.

Figure 13:
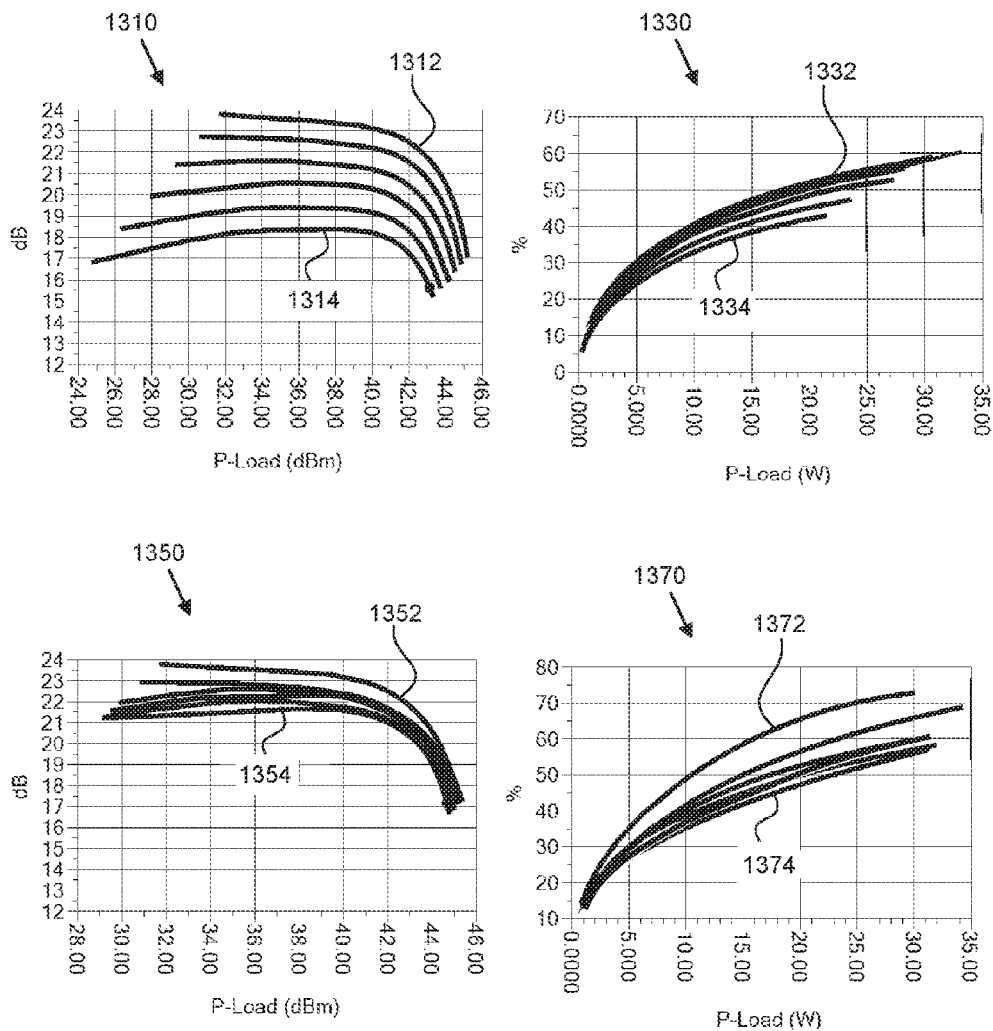
FIG. 13 includes a collection of graphs comparing drive-up gain and efficiency response curves for a conventional distributed amplifier and a distributed amplifier designed in accordance with an example embodiment.
Figure 14:
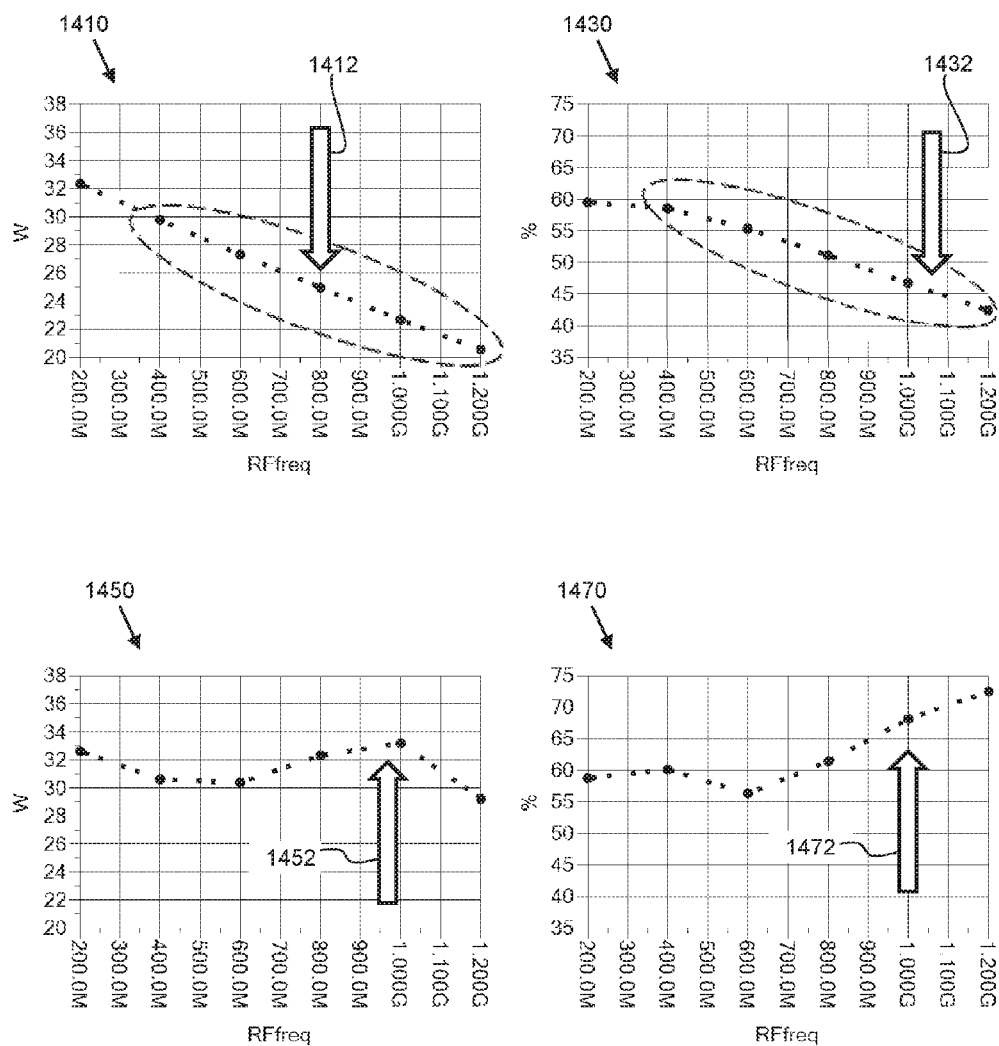
FIG. 14 includes a collection of graphs comparing saturated output power and efficiency curves for a conventional distributed amplifier and a distributed amplifier designed in accordance with an example embodiment.

As will be explained later in conjunction with FIGS. 13 and 14, the intrinsic impedance improvements resulting from the compensation circuits may result in corresponding improvements in amplifier gain and efficiency drive-up responses (FIG. 13), as well as improvements in the frequency response under full drive conditions (FIG. 14). By appropriately compensating for the impedance degradation due to the active device parasitics, each active device ultimately is able to deliver more power into the load.

Figure 6:
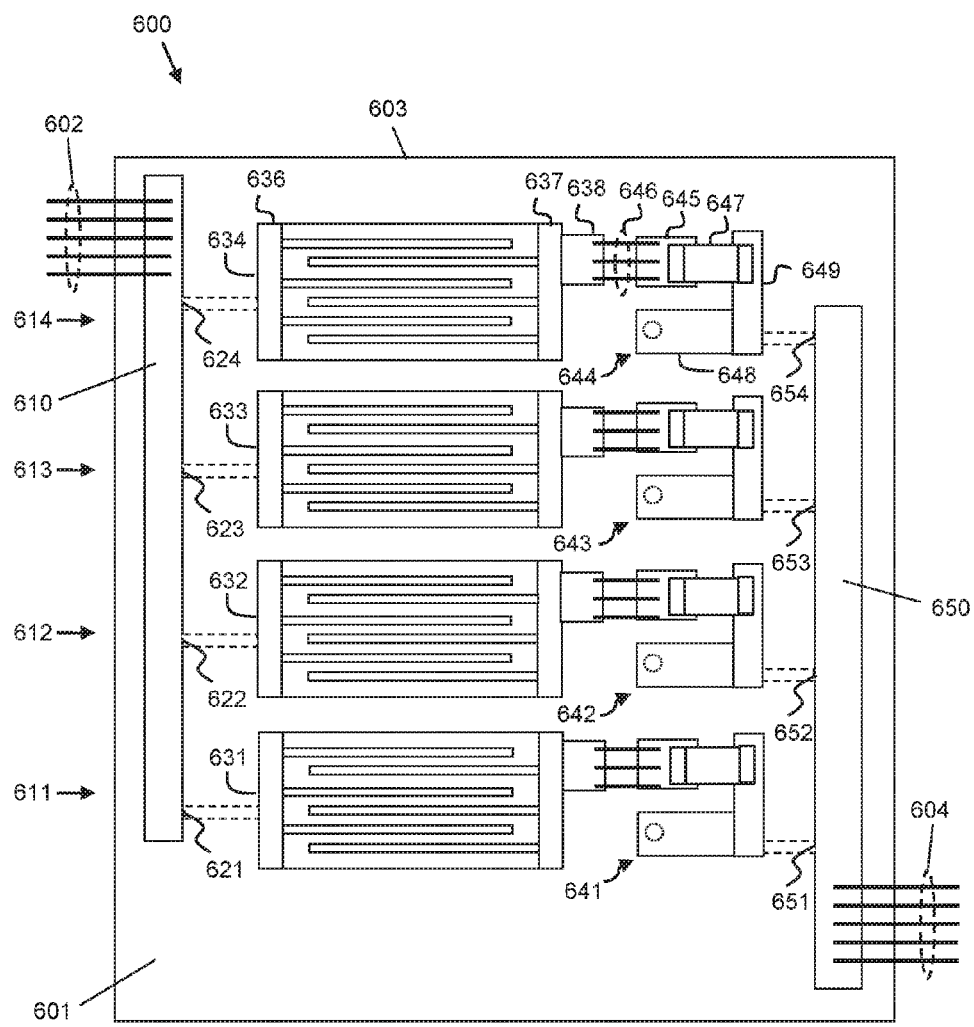
FIG. 6 is a top view of a monolithic distributed amplifier device that embodies the compensation circuit of FIG. 3, in accordance with an example embodiment.
Figure 10:
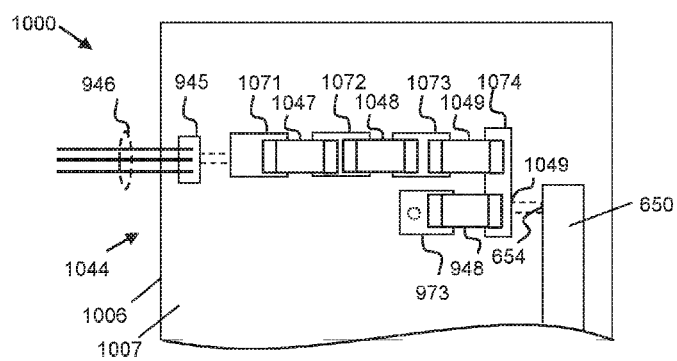
FIG. 10 is a top view of an implementation of the compensation circuit of FIG. 3, in accordance with another example embodiment.
Figure 11:
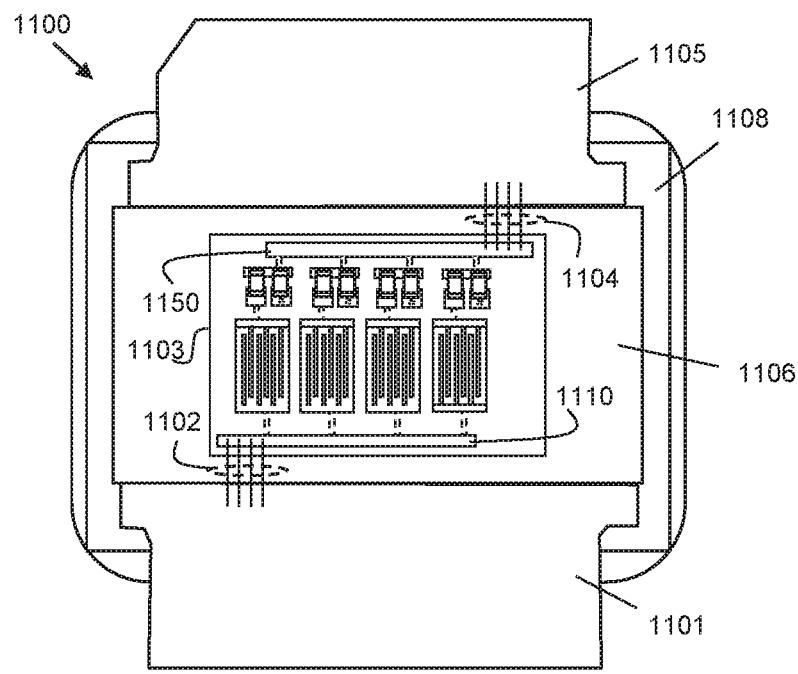
FIG. 11 is a top view of a packaged distributed amplifier, in accordance with an example embodiment.
Figure 12:
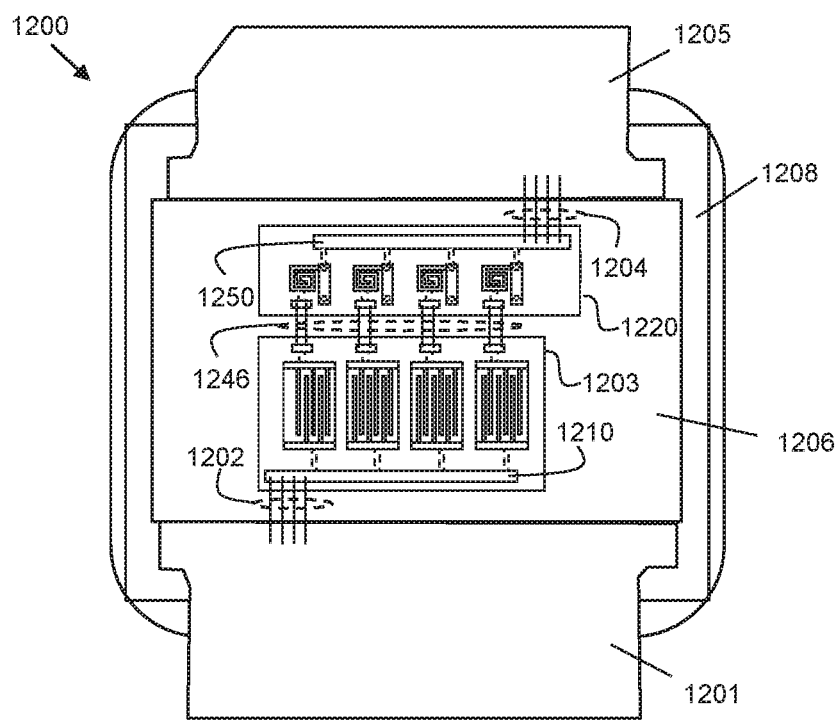
FIG. 12 is a top view of a packaged distributed amplifier, in accordance with another example embodiment.

Several example embodiments of physical implementations of distributed amplifiers with compensation circuits will now be described in conjunction with FIGS. 6-12, starting with integrated circuit (IC) level implementations (FIGS. 6-10), and working toward packaged device level implementations (FIGS. 11 and 12). Starting first with an IC level implementation, FIG. 6 is a top view of a monolithic distributed amplifier device 600 that embodies the compensation circuit 340 of FIG. 3, in accordance with an example embodiment. Distributed amplifier device 600 is considered to be "monolithic," in that substantially all of the components of the distributed amplifier are integrated within and/or physically coupled to the top surface 601 of a single semiconductor substrate 603. As will be described later in conjunction with FIG. 11, the monolithic implementation of distributed amplifier device 600 may be contained within a discrete package that may be physically and electrically coupled to a larger electrical system.

In various embodiments, the semiconductor substrate 603 may comprise silicon (Si), silicon-on-insulator (SOI), silicon-on-sapphire (SOS), gallium arsenide (GaAs), gallium nitride (GaN), GaN on silicon carbide (SiC), GaN on silicon, or other types of substrate materials. For example, the substrate 603 may have a thickness in a range of about 50 microns to about 100 microns (e.g., about 75 microns), although the substrate 603 may be thinner or thicker, as well. The substrate 603 may include, for example, a base semiconductor substrate and one or more additional semiconductor layers epitaxially formed on the surface of the base semiconductor substrate. In a particular example embodiment, the substrate 603 is a high-resistivity silicon substrate (e.g., a silicon substrate having bulk resistivity in a range of about 1000 ohm/centimeter (cm) to about 100,000 ohm/cm or greater). Alternatively, the substrate 603 may be a semi-insulating GaAs substrate (e.g., a GaAs substrate having bulk resistivity up to $10^8$ ohm/cm), or another suitable high-resistivity substrate. In still other embodiments, the substrate may be a GaN substrate or a variant of a GaN substrate, which may be particularly well suited as GaN transistors tend to have a relatively-low output capacitance. In such embodiments, electrical connections between the top and bottom substrate surfaces may be made using conductive through substrate vias (TSVs). Alternatively, electrical connections between top and bottom substrate surfaces may be made using wrap-around terminations or using other conductive structures. Still other embodiments may be implemented using low-resistivity substrates.

A plurality of alternating patterned conductive layers and dielectric layers may be formed over the surface of the semiconductor substrate, and conductive vias may be formed between portions of the conductive layers to provide for electrical connectivity between components of the device 600. In addition, portions of one or more of the patterned conductive layers may be used to form some of the components of the device 600, such as an input transmission line 610 and an output collection line 650, for example. Other portions of one or more of the patterned conductive layers (most likely a highest patterned conductive layer) may be used to form bonding pads for interconnection with bondwires, as will be discussed in more detail below.

In the embodiment illustrated in FIG. 6, a complete distributed amplifier is implemented monolithically in and on substrate 603. More specifically, the distributed amplifier includes four feeding branches 611-614 electrically coupled between an input transmission line 610 and an output collection line 650. Although the embodiment of FIG. 6 illustrates a distributed amplifier device 600 with four parallel-coupled feeding branches 611-614, embodiments of the inventive subject matter may be implemented in distributed amplifiers with fewer (e.g., as few as two) or more (e.g., ten or more) feeding branches.

According to an embodiment, the input transmission line 610 is an elongated portion of a conductive layer, with an input end (i.e., the end proximate to feeding node 624) that is configured for attachment with an input bondwire array 602. When coupled to a larger electrical system, the input bondwire array 602 is configured to receive an RF input signal, and to provide the RF input signal to the input end of the input transmission line 610. A plurality of feeding nodes 621-624 are distributed along a length of the input transmission line 610, as previously discussed.

Each feeding branch 611-614 has an input coupled to the input transmission line 610 at a feeding node 621-624, and an output coupled to the output collection line 650 at a tap node 651-654. According to various embodiments, each feeding branch 611-614 includes one or more power transistors 631-634 and a compensation circuit 641-644 coupled in series between a feeding node 621-624 and a tap node 651-654. The one or more power transistors 631-634 in each feeding branch 611-614 provide for amplification of the RF signal received through the feeding node 621-624 to which the transistors 631-634 are electrically connected (e.g., the transistors 631-634 correspond to amplifiers 231-234, 330, FIGS. 2, 3). Although FIG. 6 illustrates only one power transistor 631-634 in each feeding branch 611-614, which corresponds to a single stage amplifier, alternate embodiments may include multiple-stage amplifiers in each feeding branch 611-614.

The transistors 631-634 are the primary active components of device 600. Each transistor 631-634 includes a control terminal 636 and two current conducting terminals, where the current conducting terminals are spatially and electrically separated by a variable-conductivity channel. For example, each transistor 631-634 may be a field effect transistor (FET) (such as a high electron mobility transistor (HEMT) or a metal oxide semiconductor FET (MOSFET)), which includes a gate (control terminal 636), a drain (a first current conducting terminal 637), and a source (a second current conducting terminal). Alternatively, each transistor 631-634 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). In the embodiment of FIG. 6, each transistor 631-634 is implemented as a multi-finger transistor in which elongated source, drain, and channel regions are interdigitated across the device, and elongated gate and drain contacts are electrically coupled to conductive gate and drain manifolds (conductive contacts indicated with reference numbers 636 and 637, respectively). Other transistor structures alternatively could be used.

According to an embodiment, and using nomenclature typically applied to MOSFETs in a non-limiting manner, the gate 636 of each transistor 631-634 is coupled to a feeding node 621-624 through integrated conductive paths (indicated with dashed lines), the drain of each transistor 631-634 is coupled to an input of a compensation circuit 641-644, and the source of each transistor 631-634 is coupled to a ground reference (i.e., ground or another voltage reference). For example, coupling of the sources to the ground reference may be made using conductive TSVs to the bottom surface of the substrate 603. Through the variation of control signals (e.g., input RF signals) provided to the gates 636 of transistors 631-634, the current between the current conducting terminals of the transistors 631-634 may be modulated, thus providing for amplification of the input RF signals.

A compensation circuit 641-644 (e.g., compensation circuit 340, FIG. 3) is electrically coupled between the output terminal 637 of each transistor 631-634 and a tap node 651-654 (e.g., one of tap nodes 251-254, FIG. 2). More specifically, in an embodiment, each compensation circuit 641-644 has an input 638 that is electrically coupled to the output terminal 637 of each transistor 631-634, and an output 649 that is electrically coupled to a tap node 651-654 through an integrated conductive path (indicated with dashed lines).

In the embodiment illustrated in FIG. 6, each compensation circuit 641-644 includes two series coupled inductances 646, 647 (e.g., inductances 346, 347, FIG. 3) electrically coupled between the input 638 and output 649 of the compensation circuit 641-644, with an intermediate node 645 between the inductances 646, 647. In addition, each compensation circuit 641-644 includes a shunt capacitance 648 (e.g., shunt capacitance 348, FIG. 3) with a first terminal (or electrode or plate) electrically coupled to the series inductance 647 (or to the output 649), and a second terminal (or electrode or plate) electrically coupled to a ground reference node (e.g., using conductive TSVs to the bottom surface of the substrate 603).

The first series inductance 646 (e.g., inductance 346, FIG. 3) is implemented with one or more bondwires (e.g., a bondwire array) coupled between the input 638 and the intermediate node 645, in an embodiment. To accommodate the bondwire inductance 646, both the input 638 and the intermediate node 645 may include conductive pads exposed at the top surface 601 of the substrate 603, and which are configured for bondwire attachment. Although the inductance 646 is shown to include three parallel bondwires, the inductance 646 may be implemented to include fewer or more bondwires, as well. According to an embodiment, inductance 646 has an inductance value in a range from about 0.2 nH to about 1.0 nH, although the inductance value may be smaller or larger, in other embodiments.

The second series inductance 647 (e.g., inductance 347, FIG. 3) is implemented with a discrete inductor (e.g., a chip inductor) with a first terminal coupled to the intermediate node 645 and a second terminal coupled to the output 649, in an embodiment. To accommodate attachment of the discrete inductor 647 to the substrate 603, the intermediate node 645 and the output 649 may include conductive pads, which are exposed at the top surface 601 of the substrate 603, and which are configured for solder or conductive adhesive attachment of the discrete inductor 647. According to an embodiment, inductor 647 has an inductance value in a range from about 10 nH to about 40 nH, although the inductance value may be smaller or larger, in other embodiments.

Besides the bondwire inductance 646 and the discrete inductance 647, additional non-trivial inductances from various other conductive structures (e.g., traces, pads, vias, and so on) may be series coupled between the transistor output terminal 637 and the compensation circuit output 649. Any such inductances may be considered to be included within inductance 646 or 647, depending on the locations of such inductances. In addition, although the bondwire inductance 646 and the discrete inductance 647 are shown in a particular serial sequence, their positions in the series could be switched, in an alternate embodiment (i.e., inductance 646 could be a discrete inductor, and inductance 647 could be a bondwire inductor).

The shunt capacitance 648 (e.g., shunt capacitance 348, FIG. 3) is implemented with an integrated area capacitor, in an embodiment. More particularly, shunt capacitance 648 includes a first electrode formed from a portion of a first conductive layer integrated with the substrate 603, and a second electrode formed from a portion of a second conductive layer integrated with the substrate 603, where the first and second electrodes have overlapping conductive areas that are separated by a portion of a dielectric layer integrated with the substrate 603. In alternate embodiments, the area capacitor may be include multi-layer electrodes (e.g., wherein each electrode is formed from portions of multiple conductive layers).

The first electrode of shunt capacitance 648 is electrically coupled to the output 649, and the second electrode is electrically coupled to a ground reference node (e.g., through TSVs to the bottom of the substrate 603, as indicated with the dotted circle). According to an embodiment, shunt capacitance 648 has a capacitance value in a range from about 0.3 pF to about 1.5 pF, although the capacitance value may be smaller or larger, in other embodiments.

According to some embodiments, and as mentioned previously, the multiple compensation circuits 641-644 in distributed amplifier 600 may be identical to each other. In other embodiments, the multiple compensation circuits 641-644 may have the same components (e.g., the same number and arrangement of inductances and capacitances), but the values of the components may be different in different feeding branches 611-614. In still other embodiments, the multiple compensation circuits 641-644 may have different components (e.g., a different number and/or arrangement of inductances and capacitances).

According to an embodiment, the output transmission line 650 is an elongated portion of a conductive layer, with an output end that is configured for attachment with an output bondwire array 604. The output transmission line 650 is a tapered collection line, in an embodiment, with a plurality of consecutive segments having a particular geometric and impedance ratios, as discussed previously. The output transmission line 650 may be designed to carry relatively high currents (e.g., significantly higher currents than the input transmission line 610). For example, in some embodiments, the output collection line 650 may be formed from a portion of a highest conductive layer, and an additional layer of copper (or some other metal) may be formed over that portion of the highest conductive layer to increase the current-carrying capability of the output collection line 650.

The plurality of tap nodes 651-654, to which the outputs of the compensation circuits 641-644 are coupled, are distributed along a length of the output transmission line 650, as previously discussed. The output collection line 650 is configured to receive (via the tap nodes 651-654) and to combine the amplified RF signals produced by each of the feeding branches 611-614, and to produce an output RF signal 604 at an output end of the output collection line 650 (i.e., the end proximate to tap node 651). When coupled to a larger electrical system, the output bondwire array 604 is configured to receive the combined RF output signal carried by the output transmission line 650, and to provide the RF input signal to other portions of the larger electrical system (e.g., to an antenna for transmission over an air interface).

Figure 7:
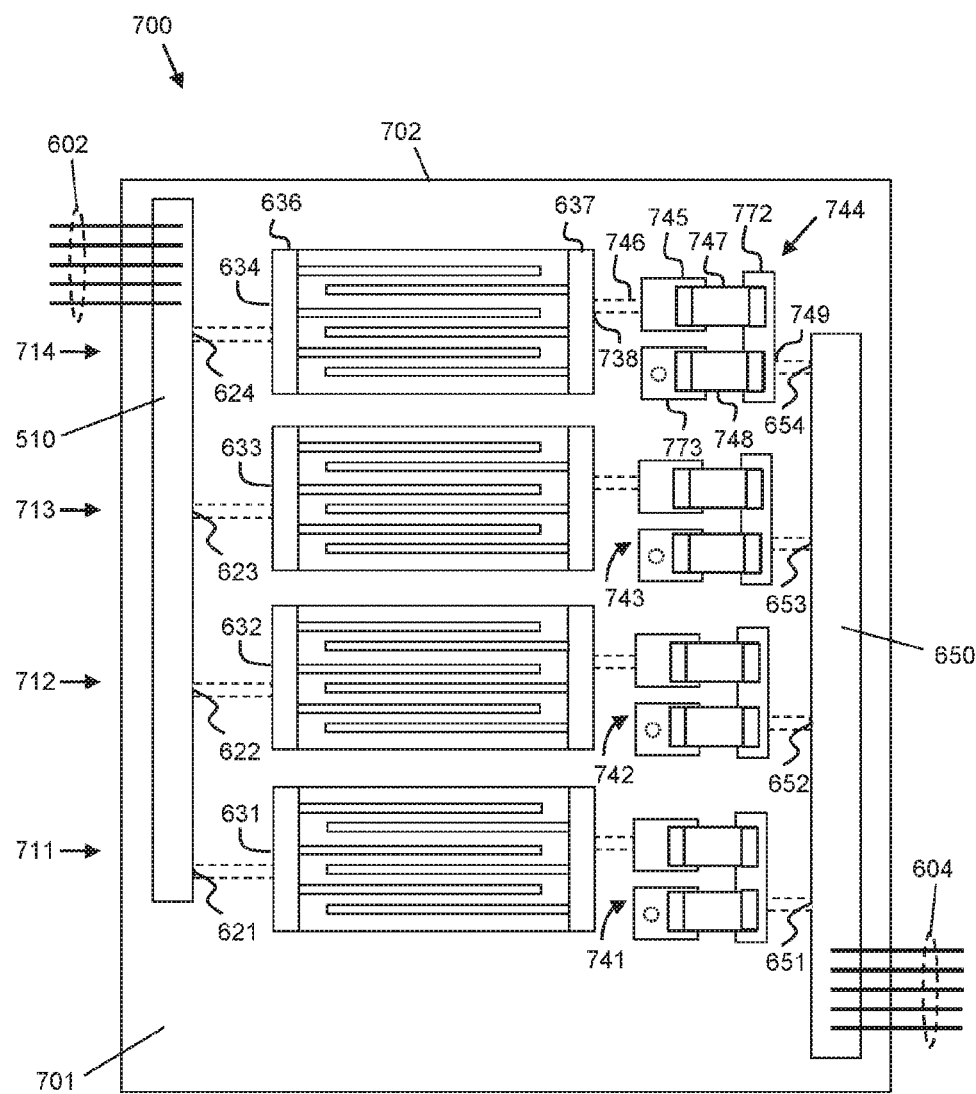
FIG. 7 is a top view of a monolithic distributed amplifier device that embodies the compensation circuit of FIG. 3, in accordance with another example embodiment.

As indicated previously, other embodiments of compensation circuits may implement their various inductances and capacitances using different types of components. For example, FIG. 7 is a top view of a monolithic distributed amplifier device 700 that embodies the compensation circuit of FIG. 3, but which implements the circuit in a different manner, in accordance with another example embodiment. The device 700 of FIG. 7 has many similarities to the device 600 of FIG. 6, and where the description of similar or identical elements applies also to device 700, identical reference numbers are used. For brevity, the details of those similar or identical elements are not repeated here, but are intended to apply equally.

As with the device 600 of FIG. 6, distributed amplifier device 700 is a monolithic implementation of a distributed amplifier implemented on a single semiconductor substrate 702 (e.g., a silicon, SOI, SOS, GaAs, GaN, GaN on SiC, GaN on Si, and so on). The substrate 702 may be substantially identical to substrate 603, with the exception of some differences in the conductive interconnect features and conductive pads as they relate to the different implementation of the compensation circuits 741-744, described below. Accordingly, the discussion of most of the details of the embodiments of substrate 603 apply equally to substrate 702. The monolithic implementation of distributed amplifier device 700 may be contained within a discrete package that may be physically and electrically coupled to a larger electrical system, as will be described later in conjunction with FIG. 11.

Also consistent with the device 600 of FIG. 6, distributed amplifier device 700 includes a plurality of, in this case four, feeding branches 711-714 electrically coupled between an input transmission line 610 and an output collection line 650. Again, although the embodiment of FIG. 7 illustrates a distributed amplifier device 700 with four parallel-coupled feeding branches 711-714, embodiments of the inventive subject matter may be implemented in distributed amplifiers with fewer (e.g., as few as two) or more (e.g., ten or more) feeding branches. The input bondwire array 602, input transmission line 610, transistors 631-634, output collection line 650, and output bondwire array 604 may be substantially the same between devices 600 and 700, and all of their various embodiments, previously-discussed, also apply to embodiments of device 700. Further, with the exception of the construction of the compensation circuits 741-744, the feeding branches 711-714 may be substantially the same as the feeding branches 611-614 described above in conjunction with device 600. Therefore, the discussion of most of the details of the embodiments of the feeding branches 611-614 also apply equally to device 700. Accordingly, the discussion of most of the details of the embodiments of the feeding branches 711-714, input bondwire array 602, input transmission line 610, transistors 631-634, output collection line 650, and output bondwire array 604 apply equally to the corresponding elements in FIG. 7.

Also similar to the device of FIG. 6, a compensation circuit 741-744 (e.g., compensation circuit 340, FIG. 3) is electrically coupled between the output terminal 637 of each transistor 631-634 and a tap node 651-654 (e.g., one of tap nodes 251-254, FIG. 2). More specifically, in an embodiment, each compensation circuit 741-744 has an input 738 that is electrically coupled to the output terminal 637 of each transistor 631-634, and an output 749 that is electrically coupled to a tap node 651-654 through an integrated conductive path (indicated with dashed lines).

The primary difference between devices 600, 700 is in the construction of the compensation circuits 741-744. In the embodiment illustrated in FIG. 7, each compensation circuit 741-744 includes two series coupled inductances 746, 747 (e.g., inductances 346, 347, FIG. 3) electrically coupled between the input 738 and output 749 of the compensation circuit 741-744, with an intermediate node 745 between the inductances 746, 747. In addition, each compensation circuit 741-744 includes a shunt capacitance 748 (e.g., shunt capacitance 348, FIG. 3) with a first terminal (or electrode or plate) electrically coupled to the series inductance 747 (or to the output 749), and a second terminal (or electrode or plate) electrically coupled to a ground reference node (e.g., using conductive TSVs to the bottom surface of the substrate 702).

The first series inductance 746 (e.g., inductance 346, FIG. 3) is implemented with an integrated conductive path, including an integrated conductive trace (indicated with dashed lines) and potentially one or more conductive vias, which are coupled between the input 738 and the intermediate node 745, in an embodiment. According to an embodiment, inductance 746 has an inductance value in a range from about 0.05 nH to about 0.7 nH, although the inductance value may be smaller or larger, in other embodiments.

The second series inductance 747 (e.g., inductance 347, FIG. 3) is implemented with a discrete inductor (e.g., a chip inductor) with a first terminal coupled to the intermediate node 745 and a second terminal coupled to a conductive pad 772, which in turn is electrically coupled to the output 749, in an embodiment. To accommodate attachment of the discrete inductor 747 to the substrate 702, the intermediate node 745 is a conductive pad. The intermediate node 745 and conductive pad 772 both are exposed at the top surface 701 of the substrate 702, and each is configured for solder or conductive adhesive attachment of the discrete inductor 747. According to an embodiment, inductor 747 has an inductance value in a range from about 10 nH to about 40 nH, although the inductance value may be smaller or larger, in other embodiments.

Besides the conductive path inductance 746 and the discrete inductance 747, additional non-trivial inductances from various other conductive structures (e.g., traces, pads, vias, and so on) may be series coupled between the transistor output terminal 637 and the compensation circuit output 749. Any such inductances may be considered to be included within inductance 746 or 747, depending on the locations of such inductances. In addition, although the conductive path inductance 746 and the discrete inductance 747 are shown in a particular serial sequence, their positions in the series could be switched, in an alternate embodiment (i.e., inductance 746 could be a discrete inductor, and inductance 747 could be a conductive path inductance).

The shunt capacitance 748 (e.g., shunt capacitance 348, FIG. 3) is implemented with chip capacitor, in an embodiment with a first terminal coupled to conductive pad 772 (which is electrically coupled to the output 749), and a second terminal coupled to another conductive pad 773.

Conductive pad 773 is electrically coupled to a ground reference node (e.g., through TSVs to the bottom of the substrate 702, as indicated with the dotted circle). To accommodate attachment of the discrete capacitor 748 to the substrate 702, conductive pads 772, 773 both are exposed at the top surface 701 of the substrate 702, and each is configured for solder or conductive adhesive attachment of the discrete capacitor 748. According to an embodiment, shunt capacitor 748 has a capacitance value in a range from about 0.3 pF to about 1.5 pF, although the capacitance value may be smaller or larger, in other embodiments.

As with the amplifier 600 (FIG. 6), the multiple compensation circuits 741-744 in distributed amplifier 700 may be identical to each other. In other embodiments, the multiple compensation circuits 741-744 may have the same components (e.g., the same number and arrangement of inductances and capacitances), but the values of the components may be different in different feeding branches 711-714. In still other embodiments, the multiple compensation circuits 741-744 may have different components (e.g., a different number and/or arrangement of inductances and capacitances).

In the embodiments of FIGS. 6 and 7, substantially the entire distributed amplifier 600, 700 is implemented monolithically with a single semiconductor substrate 603, 702. In other embodiments, such as those illustrated in FIGS. 8 and 9, portions of the compensation circuits may be realized using passive components included within distinct integrated passive device (IPD) substrates.

Figure 8:
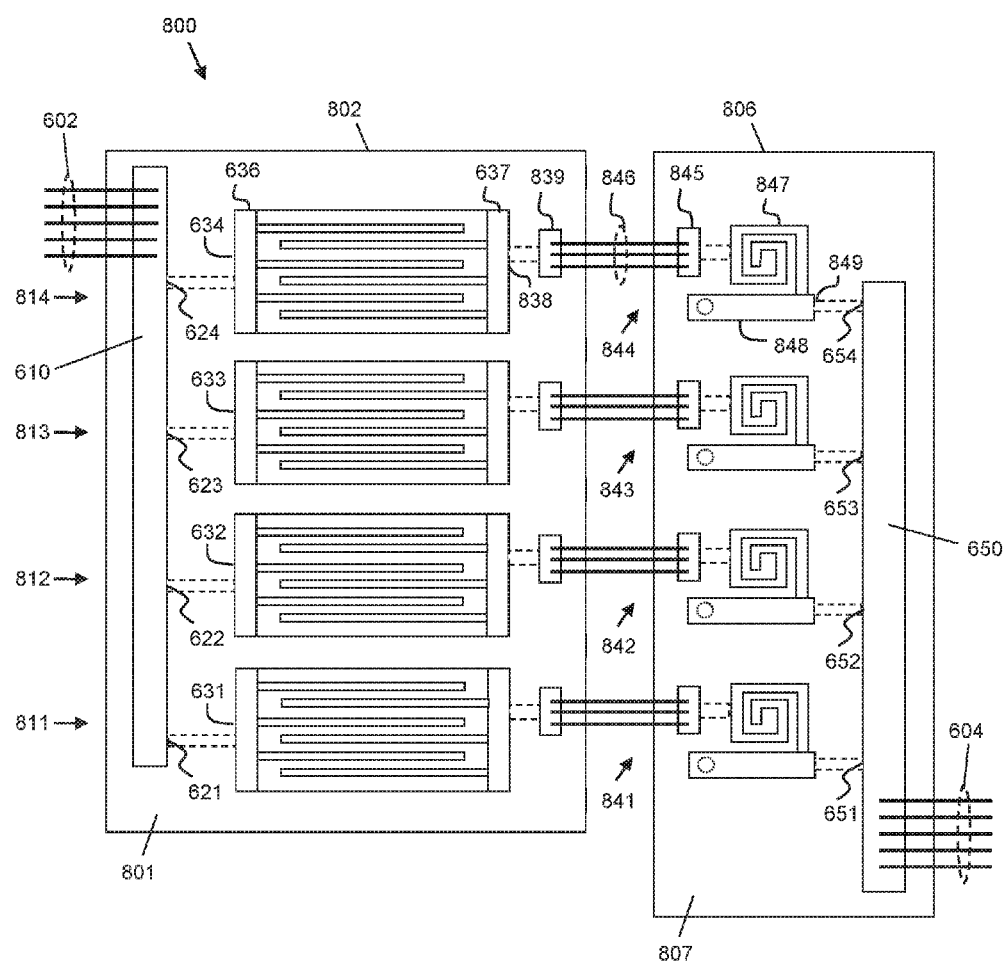
FIG. 8 is a top view of a distributed amplifier device with a portion of the compensation circuit of FIG. 3 implemented on an integrated passive device, in accordance with an example embodiment.

For example, FIG. 8 is a top view of a distributed amplifier device 800 with a portion of the compensation circuit of FIG. 3 implemented on an IPD substrate 806 that is distinct from the active device substrate 802, in accordance with an example embodiment. Unlike the device 600 of FIG. 6, distributed amplifier device 800 is not a monolithic implementation of a distributed amplifier, but instead is a multiple-substrate implementation of a distributed amplifier. More particularly, a first portion of the distributed amplifier that includes the input transmission line 610 and the active devices (i.e., transistors 631-634) is implemented on a first substrate 802 (e.g., a silicon, SOI, SOS, GaAs, GaN, GaN on SiC, GaN on Si, and so on), and a second portion of the distributed amplifier that includes the output collection line 650 and some components of the compensation circuits 841-844 is implemented on a second substrate 806, referred to herein as an "integrated passive device substrate" or "IPD substrate." The multiple-substrate implementation of distributed amplifier device 800 may be contained within a discrete package that may be physically and electrically coupled to a larger electrical system, as will be described later in conjunction with FIG. 12.

Substrate 802 may be substantially identical to substrate 603, with the exception of various differences in the conductive interconnect features and conductive pads as they relate to the different implementation of the compensation circuits 841-844. Accordingly, the discussion of most of the details of the embodiments of substrate 603 apply equally to substrate 802. Substrate 806 also may be a semiconductor substrate (e.g., a silicon, SOI, SOS, GaAs, GaN, GaN on SiC, GaN on Si, and so on), in some embodiments. In other embodiments, substrate 806 may be formed from printed circuit board (PCB) materials, including one or more patterned conductive layers and one or more dielectric layers. Alternatively, substrate 806 may be a multi-layer, low-temperature co-fired ceramic (LTCC) substrate, or a substrate formed from other materials.

Consistent with the device 600 of FIG. 6, distributed amplifier device 800 includes a plurality of, in this case four, feeding branches 811-814 electrically coupled between an input transmission line 610 and an output collection line 650. Again, although the embodiment of FIG. 8 illustrates a distributed amplifier device 800 with four parallel-coupled feeding branches 811-814, embodiments of the inventive subject matter may be implemented in distributed amplifiers with fewer (e.g., as few as two) or more (e.g., ten or more) feeding branches. The input bondwire array 602, input transmission line 610, transistors 631-634, output collection line 650, and output bondwire array 604 may be substantially the same between devices 600 and 800, and all of their various embodiments, previously-discussed, also apply to embodiments of device 800. Further, with the exception of the construction of the compensation circuits 841-844, the feeding branches 811-814 may be substantially the same as the feeding branches 611-614 described above in conjunction with device 600. Therefore, the discussion of most of the details of the embodiments of the feeding branches 611-614 also apply equally to device 800. Accordingly, the discussion of most of the details of the embodiments of the feeding branches 811-814, input bondwire array 602, input transmission line 610, transistors 631-634, output collection line 650, and output bondwire array 604 apply equally to the corresponding elements in FIG. 8.

Also similar to the device of FIG. 6, a compensation circuit 841-844 (e.g., compensation circuit 340, FIG. 3) is electrically coupled between the output terminal 637 of each transistor 631-634 and a tap node 651-654 (e.g., one of tap nodes 251-254, FIG. 2). More specifically, in an embodiment, each compensation circuit 841-844 has an input 838 that is electrically coupled to the output terminal 637 of each transistor 631-634, and an output 849 that is electrically coupled to a tap node 651-654 through an integrated conductive path (indicated with dashed lines).

The primary differences between devices 600, 800 is in the multiple-substrate construction of device 800 and in the construction of the compensation circuits 841-844. In the embodiment illustrated in FIG. 8, each compensation circuit 841-844 includes two series coupled inductances 846, 847 (e.g., inductances 346, 347, FIG. 3) electrically coupled between the input 838 and output 849 of the compensation circuit 841-844, with an intermediate node 845 between the inductances 846, 847. In addition, each compensation circuit 841-844 includes a shunt capacitance 848 (e.g., shunt capacitance 348, FIG. 3) with a first terminal (or electrode or plate) electrically coupled to the series inductance 847 (or to the output 849), and a second terminal (or electrode or plate) electrically coupled to a ground reference node (e.g., using conductive TSVs to the bottom surface of the substrate 806).

The first series inductance 846 (e.g., inductance 346, FIG. 3) is implemented with one or more bondwires (e.g., a bondwire array) coupled between the input 838 and the intermediate node 845, in an embodiment. To accommodate the bondwire inductance 846, the input 838 may be coupled to a conductive pad 839, which may be exposed at the top surface 801 of the substrate 802, and which is configured for bondwire attachment. In addition, the intermediate node 845 also may include a conductive pad, which may be exposed at the top surface 807 of the substrate 806, and which also is configured for bondwire attachment. Although the inductance 846 is shown to include three parallel bondwires, the inductance 846 may be implemented to include fewer or more bondwires, as well. According to an embodiment, inductance 846 has an inductance value in a range from about 0.2 nH to about 1.0 nH, although the inductance value may be smaller or larger, in other embodiments.

The second series inductance 847 (e.g., inductance 347, FIG. 3) is implemented with an integrated spiral inductor (e.g., a printed or patterned coil in one or more conductive layers of IPD substrate 806) with a first terminal coupled to the intermediate node 845 (as indicated with dashed lines) and a second terminal electrically coupled to the output 849, in an embodiment. According to an embodiment, inductor 847 has an inductance value in a range from about 10 nH to about 40 nH, although the inductance value may be smaller or larger, in other embodiments.

Besides inductances 846, 847, additional non-trivial inductances from various other conductive structures (e.g., traces, pads, vias, and so on) may be series coupled between the transistor output terminal 637 and the compensation circuit output 849. Any such inductances may be considered to be included within inductance 846 or 847, depending on the locations of such inductances.

The shunt capacitance 848 (e.g., shunt capacitance 348, FIG. 3) is implemented with an integrated area capacitor, in an embodiment. More particularly, shunt capacitance 848 includes a first electrode formed from a portion of a first conductive layer integrated with the substrate 806, and a second electrode formed from a portion of a second conductive layer integrated with the substrate 806, where the first and second electrodes have overlapping conductive areas that are separated by a portion of a dielectric layer integrated with the substrate 806. In alternate embodiments, the area capacitor may be include multi-layer electrodes (e.g., wherein each electrode is formed from portions of multiple conductive layers).

The first electrode of shunt capacitance 648 is electrically coupled to the output 649, and the second electrode is electrically coupled to a ground reference node (e.g., through TSVs to the bottom of the substrate 806, as indicated with the dotted circle). According to an embodiment, shunt capacitance 848 has a capacitance value in a range from about 0.3 pF to about 1.5 pF, although the capacitance value may be smaller or larger, in other embodiments.

According to some embodiments, and as mentioned previously, the multiple compensation circuits 841-844 in distributed amplifier 800 may be identical to each other. In other embodiments, the multiple compensation circuits 841-844 may have the same components (e.g., the same number and arrangement of inductances and capacitances), but the values of the components may be different in different feeding branches 811-814. In still other embodiments, the multiple compensation circuits 841-844 may have different components (e.g., a different number and/or arrangement of inductances and capacitances).

Figure 9:
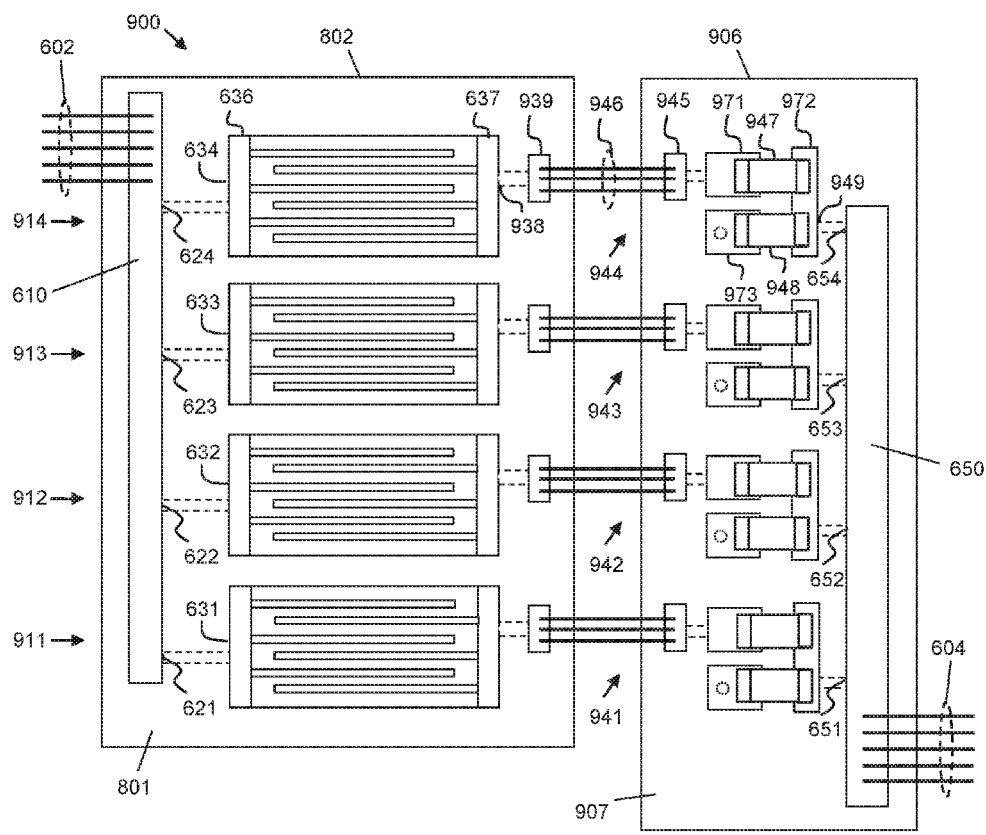
FIG. 9 is a top view of a distributed amplifier device with a portion of the compensation circuit of FIG. 3 implemented on an integrated passive device, in accordance with another example embodiment.

For another example of a multiple-substrate embodiment of a distributed amplifier, reference is made to FIG. 9, which is a top view of a distributed amplifier device 900 with a portion of the compensation circuit of FIG. 3 also implemented on an IPD substrate 906 that is distinct from the active device substrate 902, in accordance with another example embodiment. Unlike the device 600 of FIG. 6, and similar to the device 800 of FIG. 8, distributed amplifier device 900 is not a monolithic implementation of a distributed amplifier, but instead is a multiple-substrate implementation of a distributed amplifier. More particularly, a first portion of the distributed amplifier that includes the input transmission line 610 and the active devices (i.e., transistors 631-634) is implemented on a first substrate 902 (e.g., a silicon, SOI, SOS, GaAs, GaN, GaN on SiC, GaN on Si, and so on), and a second portion of the distributed amplifier that includes the output collection line 650 and some components of the compensation circuits 941-944 is implemented on a second substrate 906, referred to herein as an "integrated passive device substrate." The multiple-substrate implementation of distributed amplifier device 900 may be contained within a discrete package that may be physically and electrically coupled to a larger electrical system, as will be described later in conjunction with FIG. 12.

Substrate 902 may be substantially identical to substrates 602 and 802. Accordingly, the discussion of most of the details of the embodiments of substrate 802 (and substrate 603) apply equally to substrate 902. In addition, substrate 906 may be substantially identical to substrate 806, with the exception of various differences in the conductive interconnect features and conductive pads as they relate to the different implementation of the compensation circuits 941-944. For example, substrate 906 also may be a semiconductor substrate (e.g., a silicon, SOI, SOS, GaAs, GaN, GaN on SiC, GaN on Si, and so on), in some embodiments. In other embodiments, substrate 906 may be formed from PCB materials, including one or more patterned conductive layers and one or more dielectric layers. Alternatively, substrate 906 may be a multi-layer LTCC substrate, or a substrate formed from other materials.

Consistent with the devices 600, 800 of FIGS. 6, 8, distributed amplifier device 900 includes a plurality of, in this case four, feeding branches 911-914 electrically coupled between an input transmission line 610 and an output collection line 650. Again, although the embodiment of FIG. 9 illustrates a distributed amplifier device 900 with four parallel-coupled feeding branches 911-914, embodiments of the inventive subject matter may be implemented in distributed amplifiers with fewer (e.g., as few as two) or more (e.g., ten or more) feeding branches. The input bondwire array 602, input transmission line 610, transistors 631-634, output collection line 650, and output bondwire array 604 may be substantially the same between devices 600, 800, and 900, and all of their various embodiments, previously-discussed, also apply to embodiments of device 900. Further, with the exception of the construction of the compensation circuits 941-944, the feeding branches 911-914 may be substantially the same as the feeding branches 611-614 described above in conjunction with devices 600, 800. Therefore, the discussion of most of the details of the embodiments of the feeding branches 611-614 and 811-814 also apply equally to device 900. Accordingly, the discussion of most of the details of the embodiments of the feeding branches 911-914, input bondwire array 602, input transmission line 610, transistors 631-634, output collection line 650, and output bondwire array 604 apply equally to the corresponding elements in FIG. 9.

Also similar to the devices of FIGS. 6, 8, a compensation circuit 941-944 (e.g., compensation circuit 340, FIG. 3) is electrically coupled between the output terminal 637 of each transistor 631-634 and a tap node 651-654 (e.g., one of tap nodes 251-254, FIG. 2). More specifically, in an embodiment, each compensation circuit 941-944 has an input 938 that is electrically coupled to the output terminal 637 of each transistor 631-634, and an output 949 that is electrically coupled to a tap node 651-654 through an integrated conductive path (indicated with dashed lines).

Devices 800 and 900 are substantially similar in that both devices 800, 900 are multiple-substrate embodiments of distributed amplifiers. The primary differences between devices 800, 900 is in the construction of the compensation circuits 941-944. In the embodiment illustrated in FIG. 9, each compensation circuit 941-944 includes two series coupled inductances 946, 947 (e.g., inductances 346, 347, FIG. 3) electrically coupled between the input 938 and output 949 of the compensation circuit 941-944, with an intermediate node 945 between the inductances 946, 947. In addition, each compensation circuit 941-944 includes a shunt capacitance 948 (e.g., shunt capacitance 348, FIG. 3) with a first terminal (or electrode or plate) electrically coupled to the series inductance 947 (or to the output 949), and a second terminal (or electrode or plate) electrically coupled to a ground reference node (e.g., using conductive TSVs to the bottom surface of the substrate 906).

The first series inductance 946 (e.g., inductance 346, FIG. 3) is implemented with one or more bondwires (e.g., a bondwire array) coupled between the input 938 and the intermediate node 945, in an embodiment. To accommodate the bondwire inductance 946, the input 938 may be coupled to a conductive pad 939, which may be exposed at the top surface 907 of the substrate 902, and which is configured for bondwire attachment. In addition, the intermediate node 945 also may include a conductive pad, which may be exposed at the top surface 907 of the substrate 906, and which also is configured for bondwire attachment. Although the inductance 946 is shown to include three parallel bondwires, the inductance 946 may be implemented to include fewer or more bondwires, as well. According to an embodiment, inductance 946 has an inductance value in a range from about 0.2 nH to about 1.0 nH, although the inductance value may be smaller or larger, in other embodiments.

The second series inductance 947 (e.g., inductance 347, FIG. 3) is implemented with a discrete inductor (e.g., a chip inductor) with a first terminal coupled to a conductive pad 971 and a second terminal coupled to a conductive pad 972. Conductive pad 971 is coupled to the intermediate node 945, and conductive pad 972 is electrically coupled to the output 949, in an embodiment. To accommodate attachment of the discrete inductor 947 to the substrate 906, conductive pads 971 and 972 both are exposed at the top surface 907 of the substrate 906, and each is configured for solder or conductive adhesive attachment of the discrete inductor 947. According to an embodiment, inductor 947 has an inductance value in a range from about 10 nH to about 40 nH, although the inductance value may be smaller or larger, in other embodiments.

Besides inductances 946, 947, additional non-trivial inductances from various other conductive structures (e.g., traces, pads, vias, and so on) may be series coupled between the transistor output terminal 637 and the compensation circuit output 949. Any such inductances may be considered to be included within inductance 946 or 947, depending on the locations of such inductances.

The shunt capacitance 948 (e.g., shunt capacitance 348, FIG. 3) is implemented with chip capacitor, in an embodiment with a first terminal coupled to conductive pad 972 (which is electrically coupled to the output 949), and a second terminal coupled to another conductive pad 973. Conductive pad 973 is electrically coupled to a ground reference node (e.g., through TSVs to the bottom of the substrate 906, as indicated with the dotted circle). To accommodate attachment of the discrete capacitor 948 to the substrate 906, conductive pads 972, 973 both are exposed at the top surface 907 of the substrate 906, and each is configured for solder or conductive adhesive attachment of the discrete capacitor 948. According to an embodiment, shunt capacitor 948 has a capacitance value in a range from about 0.3 pF to about 1.5 pF, although the capacitance value may be smaller or larger, in other embodiments.

According to some embodiments, and as mentioned previously, the multiple compensation circuits 941-944 in distributed amplifier 900 may be identical to each other. In other embodiments, the multiple compensation circuits 941-944 may have the same components (e.g., the same number and arrangement of inductances and capacitances), but the values of the components may be different in different feeding branches 911-914. In still other embodiments, the multiple compensation circuits 941-944 may have different components (e.g., a different number and/or arrangement of inductances and capacitances).

In the embodiments illustrated in FIGS. 6, 7, and 9, one of the series inductances in the compensation circuit (e.g., inductance 347, FIG. 7) is implemented using a chip inductor (e.g., chip inductor 647, 747, 947, FIGS. 6, 7, 9). Depending on the desired frequency of operation, the inductance value of the chip inductor may be fairly high. The reason for this is that, generally, the effects of the active device output capacitance (Cds) increases with increasing operational frequency, and an increased output capacitance results in an increased susceptance ($j\omega C$). To appropriately compensate for increased output capacitances and susceptances at higher frequencies, higher-value chip inductors may be implemented in some embodiments of compensation circuits.

Chip inductors with higher inductance values may be implemented with a relatively large number of windings, and thus they tend to have increased inter-winding capacitance, when compared with lower-value chip inductors that include fewer windings. In some cases, the self-resonant frequency of a higher-value chip inductor may coincide with an operational band of a distributed amplifier. According to an embodiment, to avoid a situation in which the self-resonant frequency of a single high-value chip inductor may coincide with the operational band of an amplifier, a portion of the series inductance in a compensation circuit may be implemented with multiple, series-coupled chip inductors, in various embodiments. Conceptually, the multiple, series-coupled chip inductors may include about the same number of windings as the single high value chip inductor. However, because the windings are distributed between multiple chip inductors, the inter-winding capacitance within any particular one of the multiple chip inductors may be significantly less than the inter-winding capacitance of a single high-value chip inductor.

For example, FIG. 10 is a top view of a portion of a distributed amplifier 1000, which includes a compensation circuit 1044 (e.g., compensation circuit 340, FIG. 3) in which a plurality of chip inductors 1047, 1048, 1049 are used to provide at least one of the series inductances (e.g., inductance 347, FIG. 3) in the compensation circuit 1044, in accordance with another example embodiment. More specifically, FIG. 10 illustrates a top view of a portion of a substrate 1006 that includes a portion of the compensation circuit 1044.

The embodiment of FIG. 10 is similar to the compensation circuit 944 of FIG. 9, in that portions of the compensation circuit 1044 are implemented on an IPD substrate 1006 that is separate from an active device substrate (e.g., substrate 801, FIG. 9). In other embodiments, a compensation circuit that includes a plurality of series-coupled chip inductors (e.g., such as inductors 1047-1049) may be implemented monolithically with the active devices (e.g., as in the embodiments of FIGS. 6, 7). Either way, the device 1000 of FIG. 10 have many similarities to the devices 600, 700, 900 of FIGS. 6, 7, 9, and where the description of similar or identical elements applies also to device 1000, identical reference numbers are used. For brevity, the details of those similar or identical elements are not repeated here, but are intended to apply equally.

Compensation circuit 1044 (e.g., compensation circuit 340, FIG. 3) is electrically coupled between the output terminal (e.g., output terminal 637, FIG. 6, 7 or 9) of a transistor (e.g., transistor 631, FIG. 6, 7 or 9) and a tap node 654 (e.g., any one of tap nodes 251-254, FIG. 2). More specifically, in an embodiment, compensation circuit 1044 has an input (e.g., input 638, 738, 938, FIGS. 6, 7, 9) that is electrically coupled to the output terminal (e.g., output terminal 637, FIGS. 6, 7, 9) of a transistor, and an output 1049 (e.g., output 649, 749, 949, FIGS. 6, 7, 9) that is electrically coupled to a tap node 654 through an integrated conductive path (indicated with dashed lines).

In the embodiment illustrated in FIG. 10, compensation circuit 1044 includes a plurality of series coupled inductances 946, 1047, 1048, 1049 (e.g., inductances 346, 347, FIG. 3) electrically coupled between the input and output 1049 of the compensation circuit 1044, with several intermediate nodes 945, 1071, 1072, 1073 between the inductances 946, 1047-1049. In addition, compensation circuit 1044 includes a shunt capacitance 948 (e.g., shunt capacitance 348, FIG. 3) with a first terminal (or electrode or plate) electrically coupled to the series inductance 1049 (or to the output 1049), and a second terminal (or electrode or plate) electrically coupled to a ground reference node (e.g., using conductive pad 973 and conductive TSVs to the bottom surface of the substrate 1006, indicated with a dotted circle). Shunt capacitance 948 may be a chip capacitor (e.g., chip capacitors 748, 948, FIGS. 7, 9), as previously described. Alternatively, the embodiment of FIG. 10 may be modified so that the shunt capacitance is an area capacitor (e.g., area capacitor 648, 848, FIGS. 6, 8). The capacitance value of shunt capacitor 948 may be consistent with shunt capacitance values previously discussed in conjunction with FIGS. 6-9.

The first series inductance 946 (e.g., inductance 346, FIG. 3) is implemented with one or more bondwires (e.g., a bondwire array) coupled between the input (e.g., input 938, FIG. 9) of the compensation circuit 1044 and the intermediate node 945, in an embodiment. To accommodate the bondwire inductance 946, the input may be coupled to a conductive pad (e.g., conductive pad 939, FIG. 9), which may be exposed at the top surface of the active die substrate, and which is configured for bondwire attachment. In addition, the intermediate node 945 also may include a conductive pad, which may be exposed at the top surface 1007 of the substrate 1006, and which also is configured for bondwire attachment. Although the inductance 946 is shown to include three parallel bondwires, the inductance 946 may be implemented to include fewer or more bondwires, as well. According to an embodiment, inductance 946 has an inductance value in a range from about 0.2 nH to about 1.0 nH, although the inductance value may be smaller or larger, in other embodiments.

The second series inductance (e.g., inductance 347, FIG. 3) is implemented with a plurality of series-coupled discrete inductors 1047-1049 (e.g., a chip inductor) coupled between the intermediate node 945 and the output 1049 of the compensation circuit 1044. In the illustrated embodiment, the second series inductance includes three series-coupled discrete inductors 1047-1049. Alternate embodiments may include as few as two series-coupled chip inductors or more than three series-coupled chip inductors (e.g., up to 10 or more) coupled between the intermediate node 945 and the output 1049. In the three-inductor embodiment illustrated in FIG. 10, a first terminal of a first chip inductor 1047 in the series is coupled to conductive pad 1071 and a second terminal of inductor 1047 is coupled to a conductive pad 1072. A first terminal of a second chip inductor 1048 is electrically coupled to conductive pad 1072, and a second terminal of inductor 1048 is coupled to a conductive pad 1073. A first terminal of a third chip inductor 1049 is electrically coupled to conductive pad 1073, and a second terminal of inductor 1049 is coupled to a conductive pad 1074. Conductive pad 1071 is coupled to the intermediate node 945, and conductive pad 1074 is electrically coupled to the output 1049, in an embodiment. To accommodate attachment of the discrete inductors 1047-1049 to the substrate 1006, conductive pads 1071-1074 each are exposed at the top surface 1007 of the substrate 1006, and each is configured for solder or conductive adhesive attachment of the discrete inductors 1047-1049. According to an embodiment, the total inductance value of the series-coupled inductors 1047-1049 is in a range from about 10 nH to about 40 nH, although the inductance value may be smaller or larger, in other embodiments. In the illustrated embodiment, the windings needed to achieve a desired inductance value is distributed across three chip inductors 1047-1049. Because each chip inductor 1047-1049 may have fewer windings than if a single chip inductor were used, each chip inductor 1047-1049 has a smaller inter-winding capacitance than would a single high-value chip inductor. Accordingly, a self-resonant frequency that may coincide with the operational band of amplifier that includes a single high-value chip inductor may be moved outside of the operational band by implementing the series inductance with a plurality of series-coupled chip inductors.

As indicated above, each of the various implementations of distributed amplifier devices 600, 700, 800, and 900 (FIGS. 6-9) may be contained within a discrete package that may be physically and electrically coupled to a larger electrical system. For example, FIG. 11 is a top view of a packaged distributed amplifier device 1100, in accordance with an example embodiment. The packaged distributed amplifier device 1100 of FIG. 11 is specifically configured to house a monolithic embodiment of a distributed amplifier, such as the monolithic distributed amplifiers 600, 700 of FIGS. 6 and 7.

Distributed amplifier device 1100 includes an input lead 1101, an output lead 1105, a flange 1106 (or "device substrate"), an isolation structure 1108, and a monolithic distributed amplifier die 1103 (e.g., monolithic distributed amplifiers 600, 700, FIGS. 6, 7), all of which may be packaged together as parts of the device. According to an embodiment, device 1100 is incorporated in an air cavity package, in which the monolithic distributed amplifier die 1103 is located within an enclosed air cavity. Basically, the air cavity is bounded by flange 1106, isolation structure 1108, and a cap (removed in FIG. 11) overlying and in contact with the isolation structure 1108 and leads 1101, 1105. In other embodiments, the monolithic distributed amplifier die 1103 may be incorporated into an overmolded package (i.e., a package in which the electrical components of the device area are encapsulated with a non-conductive molding compound, and in which portions of the leads 1101, 1105, and all or portions of the isolation structure 1108 also may be encompassed by the molding compound).

Flange 1106 includes a rigid electrically-conductive substrate, which has a thickness that is sufficient to provide structural support for electrical components and elements of device 1100. In addition, flange 1106 may function as a heat sink for the distributed amplifier die 1103. Flange 1106 has a top and bottom surface (only a central portion of the top surface is visible in FIG. 11), and a substantially-rectangular perimeter that corresponds to the perimeter of the device 1100 (e.g., to the perimeter of isolation structure 1108, described below).

Flange 1106 is formed from a conductive material, and may be used to provide a ground reference for the device 1100. For example, the distributed amplifier die 1103 may have terminals that are electrically coupled to flange 1106 (e.g., through TSVs through the die 1103), and flange 1106 may be electrically coupled to a system ground when the device 1100 is incorporated into a larger electrical system. At least the surface of flange 1106 is formed from a layer of conductive material, and possibly all of flange 1106 is formed from bulk conductive material. Alternatively, flange 1106 may have one or more layers of non-conductive material below its top surface. Either way, flange 1106 has a conductive top surface. Flange 1106 may more generally be referred to as a substrate with a conductive surface.

Isolation structure 1108 is attached to the top surface of flange 1106. Isolation structure 1108 is formed from a rigid, electrically insulating material (i.e., a material with a dielectric constant in a range from about 3.0 to about 30.0, although materials with higher or lower dielectric constants may be used), and has a top surface and an opposed bottom surface. The term "isolation structure," as used herein, refers to a structure that provides electrical isolation between conductive features of a device (e.g., between leads 1101, 1105 and flange 1106). For example, isolation structure 1108 may be formed from inorganic materials (e.g., ceramic such as aluminum oxide, aluminum nitride, and so on) and/or organic materials (e.g., one or more polymers or printed circuit board (PCB) materials). The isolation structure 1108 may be soldered, brazed, connected with an epoxy, or otherwise attached to the flange 1106. Similarly, the leads 1101, 1105 may be soldered, brazed, connected with an epoxy, or otherwise attached to the isolation structure 1108.

Isolation structure 1108 has a frame shape, in an embodiment, which includes a substantially enclosed, four-sided structure with a central opening. Isolation structure 1108 may have a substantially rectangular shape, as shown in FIG. 11, or isolation structure 1108 may have another shape (e.g., annular ring, oval, and so on). Isolation structure 1108 may be formed as a single, integral structure, or isolation structure 1108 may be formed as a combination of multiple members. For example, in an alternate embodiment, isolation structure 1108 may include multiple portions that contact each other or that are spatially separated from each other (e.g., isolation structure 1108 may have one portion isolating input lead 1101 from flange 1106, and another portion isolating output lead 1105 from flange 1106).

The input and output leads 1101, 1105 are electrically conductive features that are mounted on a top surface of the isolation structure 1108 on opposed sides of the central opening, and thus the input and output leads 1101, 1105 are elevated above the top surface of the flange 1106, and are electrically isolated from the flange 1106. Generally, the input and output leads 1101, 1105 are oriented in order to allow for attachment of bondwires (e.g., bondwires 1102, 1104) between the input and output leads 1101, 1105 and components and elements within the central opening of isolation structure 1108.

The distributed amplifier die 1103 may be soldered, connected with a conductive epoxy, sintered, or otherwise attached to the flange 1106. An input transmission line 1110 of the distributed amplifier die 1103 is electrically coupled to the input lead 1101 with bondwires 1102 (e.g., bondwires 602, FIGS. 6, 7), and an output collection line 1150 of the distributed amplifier die 1110 is electrically coupled to the output lead 1105 with bondwires 1104 (e.g., bondwires 604, FIGS. 6, 7). Accordingly, a complete electrical path is established between the input and output leads 1101, 1105.

FIG. 12 is a top view of a packaged distributed amplifier device 1200, in accordance with another example embodiment. The packaged distributed amplifier device 1200 of FIG. 12 is specifically configured to house a multiple-substrate embodiment of a distributed amplifier, such as the multiple-substrate distributed amplifiers 800, 900 of FIGS. 8 and 9.

Distributed amplifier device 1200 includes an input lead 1201, an output lead 1205, a flange 1206 (or "device substrate"), an isolation structure 1208, an active device substrate 1203 (e.g., substrate 802, FIGS. 8, 9), and an IPD substrate 1220 (e.g., substrate 806, 906, FIGS. 8, 9), all of which may be packaged together as parts of the device. According to an embodiment, device 1200 is incorporated in an air cavity package, in which the substrates 1203, 1220 are located within an enclosed air cavity. Basically, the air cavity is bounded by flange 1206, isolation structure 1208, and a cap (removed in FIG. 12) overlying and in contact with the isolation structure 1208 and leads 1201, 1205. In other embodiments, the substrates 1203, 1220 may be incorporated into an overmolded package.

Flange 1206 includes a rigid electrically-conductive substrate, which has a thickness that is sufficient to provide structural support for electrical components and elements of device 1200. In addition, flange 1206 may function as a heat sink for the substrates 1203, 1220. Flange 1206 has a top and bottom surface (only a central portion of the top surface is visible in FIG. 12), and a substantially-rectangular perimeter that corresponds to the perimeter of the device 1200.

Flange 1206 is formed from a conductive material, and may be used to provide a ground reference for the device 1200. For example, the substrates 1203, 1220 may have terminals that are electrically coupled to flange 1206 (e.g., through TSVs through substrates 1203, 1220), and flange 1206 may be electrically coupled to a system ground when the device 1200 is incorporated into a larger electrical system. At least the surface of flange 1206 is formed from a layer of conductive material, and possibly all of flange 1206 is formed from bulk conductive material. Alternatively, flange 1206 may have one or more layers of non-conductive material below its top surface. Either way, flange 1206 has a conductive top surface.

Isolation structure 1208 is attached to the top surface of flange 1206. Isolation structure 1208 is formed from a rigid, electrically insulating material, and has a top surface and an opposed bottom surface. For example, isolation structure 1208 may be formed from inorganic materials and/or organic materials. The isolation structure 1208 may be soldered, brazed, connected with an epoxy, or otherwise attached to the flange 1206. Similarly, the leads 1201, 1205 may be soldered, brazed, connected with an epoxy, or otherwise attached to the isolation structure 1208.

Isolation structure 1208 has a frame shape, in an embodiment, which includes a substantially enclosed, four-sided structure with a central opening. Isolation structure 1208 may have a substantially rectangular shape, as shown in FIG. 12, or isolation structure 1208 may have another shape (e.g., annular ring, oval, and so on). Isolation structure 1208 may be formed as a single, integral structure, or isolation structure 1208 may be formed as a combination of multiple members. For example, in an alternate embodiment, isolation structure 1208 may include multiple portions that contact each other or that are spatially separated from each other.

The active device substrate 1203 and the IPD substrate 1220 may be soldered, connected with a conductive epoxy, sintered, or otherwise attached to the flange 1106. The input and output leads 1201, 1205 are electrically conductive features that are mounted on a top surface of the isolation structure 1208 on opposed sides of the central opening, and thus the input and output leads 1201, 1205 are elevated above the top surface of the flange 1206, and are electrically isolated from the flange 1206. Generally, the input and output leads 1201, 1205 are oriented in order to allow for attachment of bondwires (e.g., bondwires 1202, 1204) between the input and output leads 1201, 1205 and components and elements within the central opening of isolation structure 1208.

An input transmission line 1210 of the active device substrate 1203 is electrically coupled to the input lead 1201 with bondwires 1202 (e.g., bondwires 602, FIGS. 8, 9), and an output collection line 1250 of the IPD substrate 1220 is electrically coupled to the output lead 1205 with bondwires 1204 (e.g., bondwires 604, FIGS. 8, 9). In addition, the output terminal of each active device (e.g., output terminals 637, FIGS. 8, 9) is electrically coupled to an intermediate node (e.g., intermediate node 845, 945, FIGS. 8, 9) of a compensation circuit (e.g., compensation circuits 841-844, 941-944, FIGS. 8, 9) with bondwires 1246 (e.g., bondwires 846, 946, FIGS. 8, 9). Accordingly, a complete electrical path is established between the input and output leads 1201, 1205.

The embodiments of FIGS. 11 and 12 represent particular types of device packages. In other embodiments, a distributed amplifier may be packaged in other ways. For example, a distributed amplifier may be packaged as a module, in other embodiments, in which the amplifier die (or "substrates") are physically and electrically coupled to a PCB-type of substrate, rather than being coupled to a conductive flange (e.g., flange 1106, 1206, FIGS. 11, 12). In such embodiments, the input and output leads (e.g., leads 1101, 1105, 1201, 1205, FIGS. 11, 12) may be replaced with other types of input/output connections, including land grid array (LGA) or other suitable connections that are coupled to the PCB-type of substrate.

As mentioned previously in conjunction with FIG. 5, the intrinsic impedance improvements resulting from the incorporation of an embodiment of a compensation circuit in a distributed amplifier may result in corresponding improvements in amplifier gain and efficiency drive-up responses, as well as improvements in the amplifier frequency response under full drive conditions. Such improvements are indicated in FIGS. 13 and 14.

FIG. 13 includes a collection of graphs 1310, 1330, 1350, 1370 comparing drive-up gain and efficiency response curves for a conventional distributed amplifier (graphs 1310, 1330) and a distributed amplifier designed, in accordance with an example embodiment (graphs 1350, 1370). Referring first to the gain performance, graph 1310 plots gain (y-axis, in decibels (dB)) versus power (x-axis, in decibels referenced to one milliwatt (dBm)) at multiple frequencies for a conventionally-designed distributed amplifier (e.g., amplifier 100, FIG. 1), and graph 1350 plots gain (y-axis, in dB) versus power (x-axis, in dBm) at multiple frequencies for a distributed amplifier that includes embodiments of compensation circuits, as described herein (e.g., amplifier 200, FIG. 2). In both graphs 1310, 1350, gain response is plotted for frequencies between 200 MHz and 1200 MHz in 200 MHz increments.

In graph 1310, trace 1312 corresponds to the gain response at the low end of the band at 200 MHz, and trace 1314 corresponds to the gain response at the high end of the band at 1200 MHz. The significant difference between traces 1312 and 1314 (e.g., about 5.3 dB at 38.00 dBm) indicates a significantly diminished gain performance as the power is driven up to the higher-frequency portion of the band.

In graph 1350, which corresponds to performance for an embodiment of a distributed amplifier including compensation circuits, trace 1352 corresponds to the gain response at the low end of the band at 200 MHz, and trace 1354 corresponds to the gain response at the high end of the band at 1200 MHz. As can be observed, the difference between traces 1352 and 1354 (e.g., about 2.0 dB at 38.00 dBm) is significantly less than in graph 1310, indicating improved gain performance compared with a conventional distributed amplifier as the frequency is driven up to the higher-frequency portion of the band. More specifically, graph 1350 indicates that embodiments of compensation circuits included in a distributed amplifier enable the amplifier to have less gain dispersion over the band and to achieve a higher maximum gain at the high end of the band than is achievable using a conventionally-designed distributed amplifier.

Referring next to the efficiency performance, graph 1330 plots efficiency (y-axis, in percent) versus power (x-axis, in watts (W)) at multiple frequencies for a conventionally-designed distributed amplifier (e.g., amplifier 100, FIG. 1), and graph 1370 plots efficiency (y-axis, in percent) versus power (x-axis, in W) at multiple frequencies for a distributed amplifier that includes embodiments of compensation circuits, as described herein (e.g., amplifier 200, FIG. 2). In both graphs 1330, 1370, efficiency response is plotted for frequencies between 200 MHz and 1200 MHz in 200 MHz increments.

In graph 1330, trace 1332 corresponds to the efficiency response at the low end of the band at 200 MHz, and trace 1334 corresponds to the efficiency response at the high end of the band at 1200 MHz. At a power level of about 20.00 W, traces 1332 and 1334 indicate efficiencies of about 53% and about 42%, respectively, at the high and low ends of the band.

In graph 1370, which corresponds to performance for an embodiment of a distributed amplifier including compensation circuits, trace 1372 corresponds to the efficiency response at the low end of the band at 200 MHz, and trace 1374 corresponds to the efficiency response at the high end of the band at 1200 MHz. At a power level of about 20.00 W, traces 1372 and 1374 indicate efficiencies of about 66% and about 47%, respectively, at the high and low ends of the band. As can be observed through a comparison of graphs 1330 and 1370, the efficiency achievable with a distributed amplifier with an embodiment of a compensation circuit is significantly higher than the efficiency achievable with a conventional distributed amplifier, even as the frequency is driven up to the higher-frequency portion of the band.

FIG. 14 includes a collection of graphs 1410, 1430, 1450, 1470 comparing saturated output power and efficiency curves for a conventional distributed amplifier (graphs 1410, 1430) and a distributed amplifier designed in accordance with an example embodiment (graphs 1450, 1470). Referring first to the saturated output power performance, graph 1410 plots output power (y-axis, in W) versus frequency (x-axis, in MHz/GHz) for a conventionally-designed distributed amplifier (e.g., amplifier 100, FIG. 1), and graph 1450 plots output power (y-axis, in W) versus frequency (x-axis, in MHz/GHz) for a distributed amplifier that includes embodiments of compensation circuits, as described herein (e.g., amplifier 200, FIG. 2). In both graphs 1410, 1450, output power response is plotted for frequencies between 200 MHz and 1200 MHz in 200 MHz increments (with interpolated values indicated for intermediate frequencies).

Graph 1410 shows that the saturated output power for a conventional distributed amplifier drops steadily and linearly as the operational frequency increases (e.g., in the encircled portion of the plot), as indicated by arrow 1412. Conversely, graph 1450 shows that the saturated output power for a distributed amplifier that includes an embodiment of a compensation circuit does not exhibit a steady drop at higher frequencies, as indicated by the propped-up response in the area of arrow 1452.

Referring next to the saturated efficiency performance, graph 1430 plots efficiency (y-axis, in percent) versus frequency (x-axis, in MHz/GHz) for a conventionally-designed distributed amplifier (e.g., amplifier 100, FIG. 1), and graph 1470 plots efficiency (y-axis, in percent) versus frequency (x-axis, in MHz/GHz) for a distributed amplifier that includes embodiments of compensation circuits, as described herein (e.g., amplifier 200, FIG. 2). In both graphs 1430, 1470, efficiency response is plotted for frequencies between 200 MHz and 1200 MHz in 200 MHz increments (with interpolated values indicated for intermediate frequencies).

Graph 1430 shows that the saturated efficiency for a conventional distributed amplifier drops steadily and linearly as the operational frequency increases (e.g., in the encircled portion of the plot), as indicated by arrow 1432. Conversely, graph 1470 shows that the saturated efficiency for a distributed amplifier that includes an embodiment of a compensation circuit does not exhibit a steady drop at higher frequencies, as indicated by the propped-up response in the area of arrow 1472. Essentially, the results presented in FIGS. 13 and 14 demonstrate that, by appropriately compensating for the impedance degradation due to the active device parasitics using an embodiment of a compensation circuit according to the inventive subject matter, each active device of a distributed amplifier ultimately may be able to deliver more power into a load to which the amplifier is coupled, and the efficiency of the amplifier at the high end of the band may be increased significantly.

An embodiment of a distributed amplifier includes an output collection line, a plurality of tap nodes, and a plurality of amplification paths. The output collection line comprises a plurality of output transmission line segments electrically coupled in series between a first end and a second end of the output collection line. A different one of the tap nodes is located at an input end of each of the plurality of output transmission line segments. Each of the amplification paths is electrically coupled to a different one of the tap nodes. An embodiment of an amplification path includes an amplifier and a compensation circuit. The amplifier has an amplifier input and an amplifier output, and the amplifier is configured to receive an input RF signal at the amplifier input, and to amplify the input RF signal to produce an amplified RF signal at the amplifier output. The compensation circuit has a compensation circuit input and a compensation circuit output. The compensation circuit input is electrically coupled to the amplifier output, and the compensation circuit output is electrically coupled to one of the tap nodes. The compensation circuit includes a series inductance electrically coupled between the compensation circuit input and the compensation circuit output, and a shunt capacitance electrically coupled between the series inductance and a ground reference node.

An embodiment of a packaged distributed RF amplifier device includes a package substrate, a device input coupled to the package substrate, a device output coupled to the package substrate, and a distributed amplifier coupled to the package substrate. An embodiment of the distributed amplifier includes an output collection line, a plurality of tap nodes, and a plurality of amplification paths. The output collection line comprises a plurality of output transmission line segments electrically coupled in series between a first end and a second end of the output collection line. A different one of the tap nodes is located at an input end of each of the plurality of output transmission line segments. Each of the amplification paths is electrically coupled to a different one of the tap nodes. An embodiment of an amplification path includes an amplifier and a compensation circuit. The amplifier has an amplifier input and an amplifier output, and the amplifier is configured to receive an input RF signal at the amplifier input, and to amplify the input RF signal to produce an amplified RF signal at the amplifier output. The compensation circuit has a compensation circuit input and a compensation circuit output. The compensation circuit input is electrically coupled to the amplifier output, and the compensation circuit output is electrically coupled to one of the tap nodes. The compensation circuit includes a series inductance electrically coupled between the compensation circuit input and the compensation circuit output, and a shunt capacitance electrically coupled between the series inductance and a ground reference node.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A distributed amplifier comprising:
   an output collection line that includes a plurality of output transmission line segments electrically coupled in series between a first end and a second end of the output collection line;
   a plurality of tap nodes, wherein a different one of the tap nodes is located at an input end of each of the plurality of output transmission line segments; and
   a plurality of amplification paths, wherein each of the amplification paths is electrically coupled to a different one of the tap nodes, and each of the amplification paths includes
       an amplifier with an amplifier input and an amplifier output, wherein the amplifier is configured to receive an input RF signal at the amplifier input, and to amplify the input RF signal to produce an amplified RF signal at the amplifier output, and
       a compensation circuit with a compensation circuit input and a compensation circuit output, wherein the compensation circuit input is electrically coupled to the amplifier output, the compensation circuit output is electrically coupled to one of the tap nodes, and the compensation circuit includes a series inductance with a first terminal electrically coupled to the compensation circuit input and a second terminal electrically coupled to the compensation circuit output, and a shunt capacitance electrically coupled between the second terminal of the series inductance and a ground reference node, wherein the series inductance has a non-negligible inductance value, and the series inductance and the shunt capacitance form a first low pass circuit.

2. The distributed amplifier of claim 1, wherein each amplifier includes a power transistor with a control terminal corresponding to the amplifier input, and a current conducting terminal corresponding to the amplifier output, and the distributed amplifier further comprises:
   a semiconductor die, wherein the power transistor is monolithically formed with the semiconductor die, and wherein the series inductance and the shunt capacitance are physically coupled to the semiconductor die.

3. The distributed amplifier of claim 2, wherein the semiconductor die comprises a semiconductor substrate formed from a high resistivity semiconductor material with a bulk resistivity of at least 1000 ohm/centimeter, and wherein the semiconductor substrate is selected from silicon, silicon-on-insulator (SOI), silicon-on-sapphire (SOS), gallium arsenide (GaAs), gallium nitride (GaN), GaN on silicon carbide, and GaN on silicon.

4. The distributed amplifier of claim 2, wherein:
   the semiconductor die comprises first and second conductive pads exposed at a surface of the semiconductor die;
   the first conductive pad is electrically coupled to the first current conducting terminal;
   the second conductive pad is electrically coupled to the compensation circuit output; and
   the series inductance comprises a discrete inductor device with a first terminal connected to the first conductive pad, and a second terminal connected to the second conductive pad.

5. The distributed amplifier of claim 4, wherein:
   the semiconductor die further comprises a third conductive pad exposed at a surface of the semiconductor die; and
   the series inductance further comprises a plurality of bondwires electrically coupled between the third conductive pad and one of the first or second conductive pads so that the series inductance includes a series combination of a first inductance formed from the discrete inductor device and a second inductance formed from the plurality of bondwires.

6. The distributed amplifier of claim 4, wherein:
   the semiconductor die comprises first and second conductive layers formed over a surface of a semiconductor substrate;
   the shunt capacitance comprises an area capacitor formed from a portion of the first conductive layer, a portion of the second conductive layer, and dielectric material between the portions of the first and second conductive layers;
   the portion of the first conductive layer is electrically coupled to the series inductance; and
   the portion of the second conductive layer is electrically coupled to the ground reference node.

7. The distributed amplifier of claim 4, wherein:
   the semiconductor die further comprises a third conductive pad exposed at a surface of the semiconductor die and electrically coupled to the ground reference node; and
   the shunt capacitance comprises a discrete capacitor device with a first terminal connected to the third conductive pad and a second terminal electrically coupled to the second conductive pad.

8. The distributed amplifier of claim 2, wherein the output collection line is monolithically formed with the semiconductor die.

9. The distributed amplifier of claim 1, wherein each amplifier includes a power transistor with a control terminal corresponding to the amplifier input, and a current conducting terminal corresponding to the amplifier output, and the distributed amplifier further comprises:
   a semiconductor die, wherein the power transistor is monolithically formed with the semiconductor die; and
   a separate substrate from the semiconductor die, wherein the shunt capacitance is physically coupled to the separate substrate, and the series inductance comprises a plurality of bondwires coupled between the semiconductor die and the separate substrate.

10. The distributed amplifier of claim 9, wherein:
    the separate die comprises first and second conductive pads exposed at a surface of the separate die;

the first conductive pad is electrically coupled to the plurality of bondwires;

the second conductive pad is electrically coupled to the compensation circuit output; and the series inductance further comprises a discrete inductor device with a first terminal electrically coupled to the first conductive pad, and a second terminal electrically coupled to the second conductive pad so that the series inductance includes a series combination of a first inductance formed from the discrete inductor device and a second inductance formed from the plurality of bondwires.

11. The distributed amplifier of claim 9, wherein the shunt capacitance comprises one or more capacitances selected from an integrated area capacitor and a discrete capacitor device connected to conductive pads exposed at a surface of the separate die.

12. The distributed amplifier of claim 9, wherein the output collection line is physically coupled to the separate substrate.

13. The distributed amplifier of claim 1, wherein the compensation circuit further comprises at least one additional low pass circuit coupled in series with the first low pass circuit.

14. The distributed amplifier of claim 1, further comprising:
an input transmission line that includes a plurality of input transmission line segments electrically coupled in series between a first end and a second end of the input transmission line; and
a plurality of feeding nodes, wherein a different one of the feeding nodes is located at an output end of each of the plurality of input transmission line segments, and the amplifier input of each of the amplification paths is electrically coupled to a different one of the feeding nodes.

15. The distributed amplifier of claim 14, wherein each amplifier includes a power transistor with a control terminal corresponding to the amplifier input, and a current conducting terminal corresponding to the amplifier output, and the distributed amplifier further comprises:
a semiconductor die, wherein the power transistor for each amplifier and the input transmission line are monolithically formed with the semiconductor die.

16. The distributed amplifier of claim 1, wherein the series inductance comprises a plurality of discrete inductors coupled together in series.

17. A packaged distributed radio frequency (RF) amplifier device comprising:
a package substrate;
a device input coupled to the package substrate;
a device output coupled to the package substrate; and
a distributed amplifier coupled to the package substrate, wherein the distributed amplifier includes
an output collection line that includes a plurality of output transmission line segments electrically coupled in series between a first end and a second end of the output collection line, wherein the second end of the output collection line is coupled to the device output,
a plurality of tap nodes, wherein a different one of the tap nodes is located at an input end of each of the plurality of output transmission line segments, and
a plurality of amplification paths, wherein each of the amplification paths is electrically coupled to a different one of the tap nodes, and each of the amplification paths includes
an amplifier with an amplifier input and an amplifier output, wherein the amplifier is configured to receive an input RF signal at the amplifier input, and to amplify the input RF signal to produce an amplified RF signal at the amplifier output, and
a compensation circuit with a compensation circuit input and a compensation circuit output, wherein the compensation circuit input is electrically coupled to the amplifier output, the compensation circuit output is electrically coupled to one of the tap nodes, and the compensation circuit includes a series inductance with a first terminal electrically coupled to the compensation circuit input and a second terminal electrically coupled to the compensation circuit output, and a shunt capacitance electrically coupled between the second terminal of the series inductance and a ground reference node, wherein the series inductance has a non-negligible inductance value, and the series inductance and the shunt capacitance form a first low pass circuit.

18. The packaged RF amplifier device of claim 17, further comprising:
a semiconductor die connected to the device substrate, wherein each amplifier includes a power transistor with a control terminal corresponding to the amplifier input, and a current conducting terminal corresponding to the amplifier output, and wherein each power transistor is monolithically formed with the semiconductor die, and the series inductance and the shunt capacitance are physically coupled to the semiconductor die.

19. The packaged RF amplifier device of claim 17, further comprising:
an active device die connected to the device substrate, wherein each amplifier includes a power transistor with a control terminal corresponding to the amplifier input, and a current conducting terminal corresponding to the amplifier output, and wherein the power transistor of each amplifier is monolithically formed with the active device die; and
a separate substrate from the active device die, wherein the separate substrate is connected to the device substrate, and wherein the shunt capacitance is physically coupled to the separate substrate.

20. The packaged RF amplifier device of claim 19, wherein the series inductance comprises a plurality of bondwires coupled between the active device die and the separate substrate.

21. The packaged RF amplifier device of claim 19, wherein the series inductance has an inductance value of 10 nanohenries or greater.

22. The distributed amplifier of claim 1, wherein the series inductance has an inductance value of 10 nanohenries or greater.

* * * * *